(12) United States Patent
Dally et al.

(10) Patent No.: US 7,268,706 B2
(45) Date of Patent: *Sep. 11, 2007

(54) LOW POWER, DC-BALANCED SERIAL LINK TRANSMITTER

(75) Inventors: William J Dally, Palo Alto, CA (US); John W Poulton, Chapel Hill, NC (US)

(73) Assignee: Rambus, Inc., Los Altos, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/342,780

(22) Filed: Jan. 30, 2006

(65) Prior Publication Data

US 2006/0164264 A1  Jul. 27, 2006

Related U.S. Application Data

(63) Continuation of application No. 11/040,835, filed on Jan. 21, 2005, now Pat. No. 7,061,406.

(51) Int. Cl.
*H03M 5/00* (2006.01)

(52) U.S. Cl. ............................. 341/58; 341/50

(58) Field of Classification Search ............ 341/50–90, 341/93, 100, 101, 136, 141
See application file for complete search history.

(56) References Cited

U.S. PATENT DOCUMENTS

| | | | |
|---|---|---|---|
| 3,638,121 A | 1/1972 | Spilker, Jr. | |
| 4,486,739 A | 12/1984 | Franaszek et al. | |
| 4,710,922 A | 12/1987 | Scott | |
| 4,893,175 A | 1/1990 | Fukada | |
| 5,084,871 A | 1/1992 | Carn et al. | |
| 5,170,396 A | 12/1992 | Rivers et al. | |
| 5,235,617 A | 8/1993 | Mallard, Jr. | |
| 5,396,239 A * | 3/1995 | McMahon et al. | ............ 341/59 |
| 5,485,490 A | 1/1996 | Leung et al. | |
| 5,525,983 A | 6/1996 | Patel et al. | |
| 5,554,945 A | 9/1996 | Lee et al. | |
| 5,708,389 A | 1/1998 | Gabara | |
| 6,321,282 B1 | 11/2001 | Horowitz et al. | |
| 6,359,931 B1 | 3/2002 | Perino et al. | |

(Continued)

OTHER PUBLICATIONS

SLDRAM Inc., "400 Mb/s/pin SLDRAM," Draft Advance (Jul. 9, 1998), 1-69.

(Continued)

*Primary Examiner*—Lam T. Mai
(74) *Attorney, Agent, or Firm*—Haynes Beffel & Wolfeld LLP

(57) ABSTRACT

A transmitter for a data communication system that comprises a transmission line between first and second integrated circuits. An encoder on the first integrated circuit encodes an input data stream to produce a sequence of codewords, wherein codewords in the sequence are members of a set of codewords representing data in the input data stream, and the members of the set are substantially DC balanced, such as a Manchester encoded symbol set. An integrating circuit on the second integrated circuit integrates codewords by integrating for a first interval with a positive polarity within a particular signaling cell, and integrating for a second interval with a negative polarity within the particular signaling cell, to produce output representing the codewords. A sense circuit produces an output data stream.

20 Claims, 10 Drawing Sheets

U.S. PATENT DOCUMENTS

| | | | |
|---|---|---|---|
| 6,362,757 B1 * | 3/2002 | Lee et al. | 341/59 |
| 6,369,652 B1 | 4/2002 | Nguyen et al. | |
| 6,396,329 B1 | 5/2002 | Zerbe | |
| 6,448,815 B1 | 9/2002 | Talbot et al. | |
| 6,463,392 B1 | 10/2002 | Nygaard et al. | |
| 6,469,555 B1 | 10/2002 | Lau et al. | |
| 6,473,439 B1 | 10/2002 | Zerbe et al. | |
| 6,510,503 B2 | 1/2003 | Gillingham et al. | |
| 6,556,628 B1 | 4/2003 | Poulton et al. | |
| 6,556,934 B2 | 4/2003 | Higashide | |
| 6,606,350 B2 | 8/2003 | Dress, Jr. et al. | |
| 6,643,787 B1 | 11/2003 | Zerbe et al. | |
| 6,657,468 B1 | 12/2003 | Best et al. | |
| 6,788,222 B2 | 9/2004 | Hall et al. | |
| 6,804,193 B1 | 10/2004 | Dubreuil | |
| 7,061,406 B1 * | 6/2006 | Dally et al. | 341/50 |
| 2003/0108110 A1 | 6/2003 | Harres | |
| 2004/0109510 A1 | 6/2004 | Bessios et al. | |
| 2004/0233190 A1 | 11/2004 | Chow | |

OTHER PUBLICATIONS

Gillingham, Peter, "SLDRAM Architectural and Functional Overview," SLDRAM Consortium (Aug. 29, 1997), 1-14.

Gillingham, Peter, "SLDRAM: High-Performance, Open-Standard Memory," IEEE (1997), 29-39.

Redwood Technology Brief, "High Performance Parallel Bus Interface Technology," Copyright 2003 Rambus, Inc., all rights reserved, 2 pages.

RDRAM® Overview, "High Performance Memory Interface Solution," Copyright 2003 Rambus, Inc., all rights reserved, 4 pages.

Paris, Lluis et al., "WP 24.3: An 800MB/s 72 Mb SLDRAM with Digitally-Calibrated DLL," ISSCC Slide Supplement IEEE 1999, 352-353.

RAMBUS "Direct Rambus Short Channel Layout Guide, Version 0.95" (Aug. 2001), 40 pages.

RAMBUS "Direct Rambus Long Channel Design Guide" (2000), 45 pages.

Lewis, Dave, "Easy-to-Use LVDS Serdes for the Serdes Neophyte," National Semiconductor, National Edge (Sep. 2001) 5 pages, http://www.national.com/nationaledge/sep01/864.html.

RAMBUS, Inc. "RDRAM Direct Rambus Clock Generator" (Apr. 2002), 22 pages.

Yellowstone Technology Brief, "High Performance Memory Interface Technology," Copyright 2003 Rambus, Inc., all rights reserved, 2 pages.

Lee, Ming-Ju, Edward et al., "TP 15.3: A 90mW 4Gb/s Equalized I/O Circuit with input Offset Cancellation" IEEE International Solid-State Circuits Conference, pp. 252-253.

RaSer™ X Product Brief, "Highly Flexible 10 Gbps Backplane Serial Link Interface," Copyright 2003 Rambus, Inc., all rights reserved, 2 pages.

Nakamura, Kazuyuki, et al., "A 6 Gbps CMOS Phase Detecting DEMUX Module Using Half-Frequency Clock," 1998 Symposium on VLSI Circuits Digest of Technical Papers, 196-197.

Chang, Ken K. Y., et al., "A 2 Gb/s Asymmetric Serial Link for High-Bandwidth Packet Switches," Hot Interconnects V, Stanford University, Aug. 1997, 1-9.

Poulton, John, et al., A Tracking Clock Recovery Receiver for 4Gb/s Signaling, Hot Interconnects '97, Aug. 21-23, 1997, Palo Alto, CA, 1-13.

Hu, Timothy H., et al., "A Monolithic 480 Mb/s Parallel AGC/Decision/Clock-Recovery Circuit in 1.2-µ CMOS," IEEE Journal of Solid-State Circuits, vol. 28, No. 12, Dec. 1993, 1314-1320.

Dally, W, et al., "Digital Systems Engineering," Cambridge University Press, 1998, pp. 447-449.

Eldering, Charles A., et al., "Digital Burst Mode Clock Recovery Technique for Fiber-Optic Systems," Journal of Lightwave Technology, vol. 12, No. 2, Feb. 1994, 271-279.

Cerisola, M., et al., "CORD—a WDM Optical Network: Control Mechanism Using Subcarrier Multiplexing and Novel Synchronization Solutions," Communications, 1995. ICC 95 Seattle, Gateway to Globalization, 1995 IEEE International Conference on, vol. 1, Jun. 18-22, 1995, pp. 261-265 vol 1.

Banu, Mihai, et al., "TA 6.4: A 660Mv/s CMOS Clock Recovery Circuit with Instantaneous Locking for NRZ Data and Burst-Mode Transmission," IEEE International Solid State Circuits Conference, 1993, 102-103, 270.

Widmer, A.X., et al., "A DC-Balanced, Partitioned-Block, 8B/10B Transmission Code," IBM J. Res. Develop., vol. 27, No. 5, Sep. 1983, 440-451.

Nakase, Yasunobu et al, "Source-Synchronization and Timing Vernier Techniques for 1.2-GB/s SLDRAM Interface," IEEE Journal of Solid-State Circuits, vol. 34, No. 4 (Apr. 1999), 494-501.

Yang, Chih-Kong Ken "Design of High-Speed Serial Links in CMOS" Technical Report No. CSL-TR-98-775, Sponsored By Center for Integrated Systems, Sun Microsystems and LSI Logic Inc. Dec. 1998, pp. 1-182.

Kim, Sungjoon, et al, "An 800Mbps Multi-Channel CMOS Serial Link with 3x Oversampling," IEEE 1995 Custom Integrated Circuits Conference, 22.7.1-22.7.4.

Chang, Kun Yung "Design of a CMOS Asymmetric Serial Link" A Dissertation Submitted to the Department of Electrical Engineering and the Committee on Graduate Studies of Stanford University Aug. 1999, 119 pages.

"Draft Standard for a High-Speed Memory Interface (SyncLink)", Draft 0.99 IEEE P1596.7-199X (1996), 56 pages.

EIA/JEDEC Standard No. 8-B (JESD8-b) "Interface Standard for Nominal 3 V/3.3 V Supply Digital Integrated Circuits," (Sep. 1999) 12 pages.

EIA/JEDEC Standard No. 8-6 (EIA/JESD8-6) "High Speed Transceiver Logic (HSTL) A 1.5 V Output Buffer Supply Voltage Based Interface Standard for Digital Integrated Circuits," (Aug. 1995) 16 pages.

JEDEC Standard—JESD8-16 "Bus Interconnect Logic (BIC) for 1.2 Volts," (Apr. 2004) 16 pages.

Yang, Chih-Kong Ken "Design of High-Speed Serial Links in CMOS," Technical Report No. CSL-TR-98-775, Sponsored by Center for Integrated Systems, Sun Microsystems and LSI Logic, Inc. Dec. 1998, pp. 1-182.

Standard Microsystems Corporation datasheet for 10/100 Fast Ethernet PHY Transceiver, rev. Aug. 24, 2001, 22 pp.

Standard Microsystems Corporation datasheet for 10/100 Non-PCI Ethernet Single Chip MAC + PHY, rev. 1.8 (Jul. 13, 2005), 142 pp.

* cited by examiner

LOW POWER, DC-BALANCED SERIAL LINK TRANSMITTER

RELATED APPLICATIONS

This application is a continuation of U.S. patent application Ser. No. 11/040,835 filed on 21 Jan. 2005 now U.S. Pat. No. 7,061,406, which is hereby incorporated by reference as if fully set forth herein.

BACKGROUND OF THE INVENTION

1. Field of the Invention

The present invention relates to data communications; and particularly to communications operating with low power, and to integrated circuits including resources supporting such data communications.

2. Description of Related Art

The bulk of off-chip communication in modern digital signals occurs between chips on a single printed circuit board. Contemporary signaling solutions include low voltage CMOS (LVCMOS) described for example in JEDEC Standard No. 8-B (1999), high speed transceiver logic (HSTL) interfaces, described for example in JEDEC Standard No. 8-6 (1995), and high-speed serial links.

Signaling power required for communication dominates system power in many cases. A major consumer of power in the signaling system is driving the transmission line. Representative high-speed signaling systems drive transmission lines with 10-20 milliamps of current, resulting in differential signal swings of 500 millivolts to 1 volt at the transmitter on a 100 ohm line. Thus, the signal swings on contemporary communication lines consume considerable power (5-20 milliwatts from a 1 volt supply). Moreover, the large transmitters needed to drive such high currents present large clock loads, driving up the clock power required.

Higher signaling power is required for chip-to-chip communication, in part to establish signal-to-noise ratios on the communication channels that are high enough to meet rigorous bit error rate (BER) standards on the order of $10^{-9}$ or better. The typical signal swings, discussed above, are far greater than needed to overcome the fundamental noise sources in the system, such as thermal noise in the terminating resistors, that are normally in the microvolt range. However, fixed noise sources, like component imbalances, voltage offsets, cross-talk and some inter-symbol interference, have greater levels, and drive the requirements for signaling power up.

It is desirable to provide a high speed communication technology operable with low power, while meeting or exceeding BER standards.

DETAILED DESCRIPTION

In some embodiments, a signaling system as described herein operates reliably with differential signal swings of less than 50 millivolts, reducing transmitter power by as much as two orders of magnitude and reducing clock load by a comparable amount, over conventional signaling systems. The system utilizes an encoding technique that reduces or eliminates fixed noise sources, such as transmitter offset, termination offset, receiver offset, and receiver sensitivity. Some embodiments of the technology use Manchester encoded signals, or signal encoding techniques that are substantially DC balanced over 2 or more bits. In some embodiments, the data symbols require less than 100 picoJoules per bit of data. Some embodiments of the technology are capable of high-speed communication in which the data symbols require less than 20 picoJoules per bit of data, and in some embodiments 1 picoJoule or less. Some embodiments of the technology operate with high data rates, including data rates greater than 1 gigabit per second Gbps, such as 5 Gbps or higher.

Figure 1:
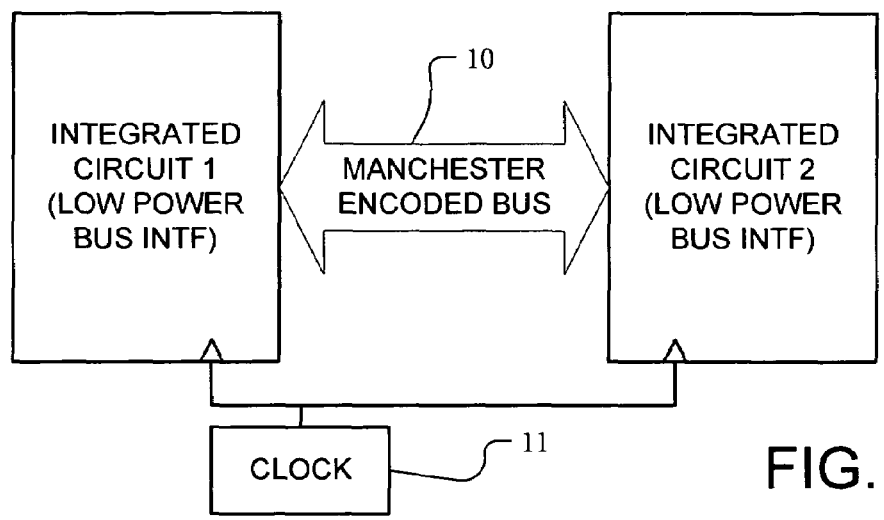
FIG. 1 illustrates a chip-to-chip communication system with a Manchester encoded bus.

FIG. 1 illustrates a basic chip-to-chip signaling system, including integrated circuit 1 and integrated circuit 2, which may be mounted on a single printed circuit board. Bus 10 comprises one or more traces of a transmission line, or a set of transmission lines, such as differential conductors on a printed circuit board, interconnecting integrated circuit 1 and integrated circuit 2. In other embodiments, the bus 10 may comprise backplane links or cables, like differential twisted pair conductors, for communication among printed circuit boards, or among machines. In other embodiments, the bus 10 may comprise a conductor on an integrated circuit for communications between a transmitter and a receiver on the same integrated circuit. Integrated circuit 1 and integrated circuit 2 have respective low-power bus interfaces adapted for communicating with a Manchester encoded data stream in the illustrated embodiment. In other embodiments, the integrated circuits 1, 2 communicate using other DC balanced encoding techniques, including multi-bit orthogonal encoding techniques, as described below.

In the relatively benign environment for signaling between chips on a board, the links are relatively short and isolated from many noise sources. For example, a typical link on a printed circuit board is 0.3 meters or less in length. In this environment, a common frequency reference can be provided by a shared clock 11, coupled to both ends of the bus 10 at integrated circuit 1 and at integrated circuit 2.

Figure 2:
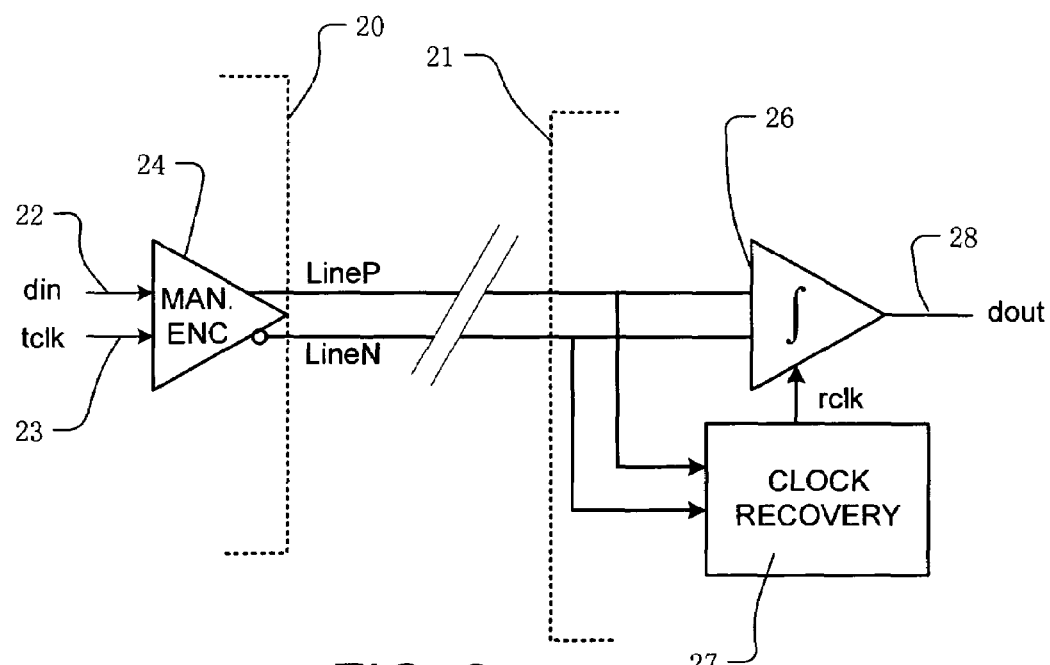
FIG. 2 is a simplified diagram of a communication channel including a Manchester encoder/driver and an integrating receiver.

A simplified block diagram of a communication channel is shown in FIG. 2. In the illustrated embodiment, the channel provides communication between integrated circuit 20 and integrated circuit 21. Core circuitry on integrated circuit 20 provides input data din and a transmit clock tclk on lines 22 and 23, respectively, to a transmitter 24. The transmitter 24 includes circuitry for combining a data stream from the input data din with the transmit clock tclk to produce an encoded data stream. The encoded data stream is Manchester encoded in one embodiment, produced by the exclusive-OR combination of the data stream with the transmit clock. The transmitter 24 also includes circuitry for driving a sequence of signal levels within a corresponding sequence of symbol cells on the positive polarity and negative polarity lines (LineP, LineN) on the transmission line between the chips. Integrated circuit 21 includes a receiver 26 and a clock recovery circuit 27. The receiver 26 integrates the sequence of signal levels received on the transmission line over a first half of each symbol cell with a first polarity, and a second half of each symbol cell with an opposite polarity, using the recovered receiver clock rclk, and senses the result of the balanced integration to provide the output data dout on line 28.

By integrating the levels d-d' over the symbol cell (see symbol cell 42 of FIG. 4) which is represented by the differential line voltage $V_L$ across LineP and LineN, the receiver generates a first pulse shape indicating the combination of <01>, and a second pulse shape indicating the combination of <10> for the d-d' symbol. Because d and d' are complements, the receiver integrates $+V_L$ during a first part of the symbol cell, and its complement, $-V_L$, during the second part of the symbol cell. A threshold sensing circuit determines the value of the transmit bit.

The Manchester encoded data is transmitted in the sequence of signal levels d-d' within respective symbol cells, where the polarity of d and d' indicates the value of the data. The Manchester encoded data cancels fixed noise sources including transmitter offset, termination offset, and receiver offset. The system also cancels low-frequency coupled noise. The noise is eliminated at the expense of the doubling bit rate, thus doubling the required channel bandwidth in the Manchester embodiment. Manchester encoded data combines clock and data in the transmission resulting in one half the bit rate for a given bandwidth. The transmission line technology for LineP and LineN is implemented using chip-to-chip differential pair wiring in the illustrated embodiment, using for example a microstrip or a stripguide in a printed circuit PC board. Thus, a microstrip transmission line can be used, formed on a surface or a layer of a PC board (air or dielectric above, dielectric below) using an internal conducting plane as the reference conductor. Also, a stripguide transmission line can be used comprising PC traces embedded in a PC board with reference planes, and PC dielectric layers above and below.

Both single-ended and differential transmission lines can be used. A single-ended transmission line typically includes a single conductor (one conductive link or a series of conductive links connected end to end) that carries a signal from terminal to terminal. Typical embodiments include a single conductor with a reference plane. A characteristic impedance can be defined for the conductor with respect to the reference plane that specifies the ratio of the voltage to the current on the line. Neither end, one end or both ends of the conductor may be terminated in the characteristic impedance of the line. The reference plane or reference conductor may be shared among a plurality of transmission lines, which together may comprise a bus.

A differential transmission line typically includes a pair of nominally identical conductors that carry a signal from terminal to terminal. An 'even-mode' and an 'odd-mode' impedance can be defined for this type of line. The even-mode impedance is the impedance presented by the pair when both lines are driven with the same excitation voltage. The odd-mode (or differential) impedance is the impedance presented by the line when the two conductors are driven with equal but opposite polarity signals. Typically both ends of the line are terminated resistively so as to match both the even- and odd-mode impedances within some tolerance. The signaling system is intended to excite only the odd (differential) mode of propagation.

Inductive or capacitive coupling can be used with either differential or single-ended transmission lines in embodiments of the technology described herein. Capacitive coupling is a method by which the signal from the transmitter is coupled to the transmission line through a series capacitor (or capacitors), and the signal from the line is coupled to the receiver through a series capacitor (or capacitors). Capacitive coupling may be used at the transmitter, the receiver, or both. Low-frequency signals are effectively isolated from the line by the coupling capacitor(s).

Inductive coupling is a method by which the signal from the transmitter is coupled to the transmission line through a transformer composed of a coil (inductor) excited by alternating current from the transmitter and another, closely coupled coil connected to the transmission line. Likewise, the signal from the transmission line may be coupled to the receiver through a similar arrangement.

Figure 3:
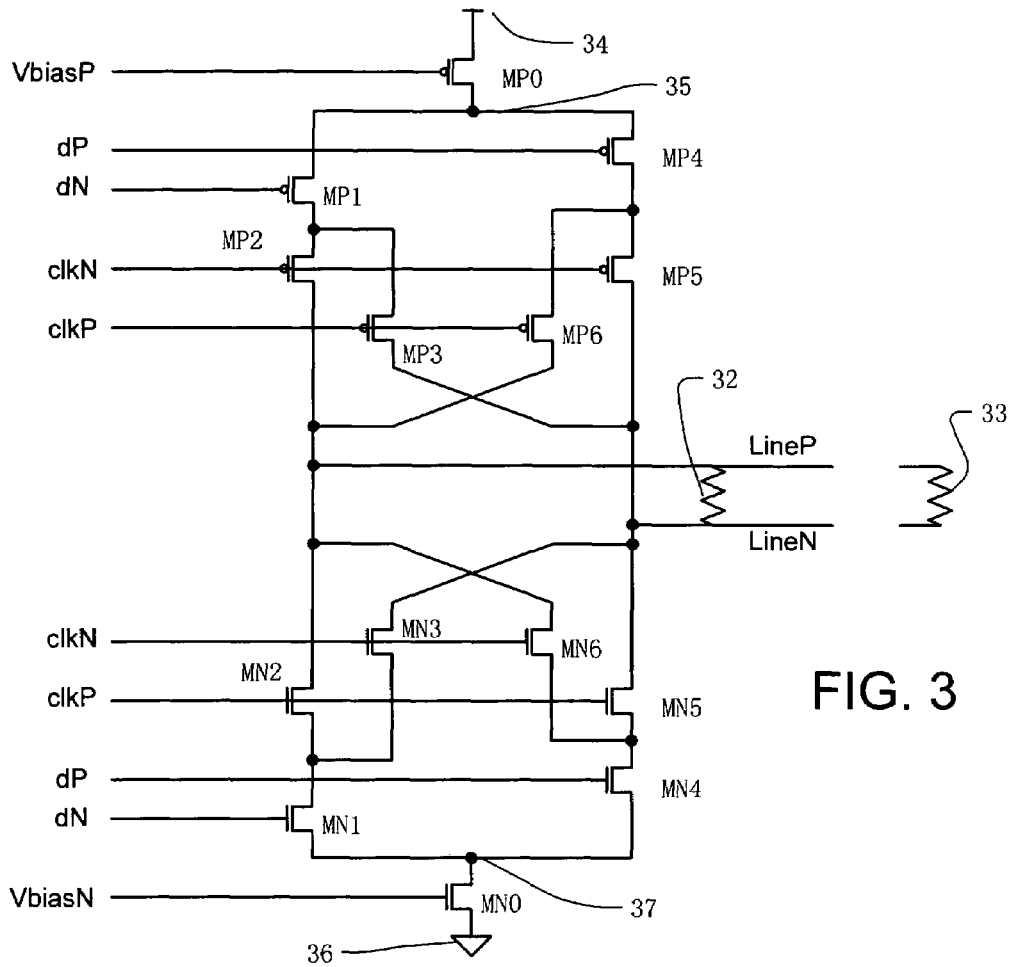
FIG. 3 is a circuit diagram for a high speed, low power Manchester encoder/driver.

FIG. 3 is a conceptual circuit diagram for a transmitter, which combines the encoding and driving functions in a single low power CMOS circuit. In the illustrated example, the circuit combines exclusive-OR encoding logic with a differential push-pull current driver that drives a differential transmission line. The differential transmission line includes LineP, a positive polarity line, and LineN, a negative polarity line. Termination resistor 32 at the proximal end of the line and termination resistor 33 at the distal end of the transmission line are provided as known in the art.

The circuit shown in FIG. 3 includes p-channel MOS transistors MP0-MP6 in a top subcircuit, and n-channel transistors MN0-MN6 in a bottom subcircuit. The bottom n-channel subcircuit is a mirror of the top p-channel subcircuit. In the top subcircuit, transistor MP0 is coupled between the supply potential 34 and node 35. The gate of transistor MP0 is coupled to a bias potential VbiasP, which helps establish a current level in the circuit. Transistors MP1 and MP2 are connected in series between the node 35 and LineP of the transmission line. Transistor MP3 is connected from the node between the transistors MP1 and MP2 to LineN of the transmission line. Transistors MP4 and MP5 are connected in series between the node 35 and LineN of the transmission line. Transistor MP6 is connected from the node between the transistors MP4 and MP5 to LineP of the transmission line.

In the bottom subcircuit, transistor MN0 is coupled between the ground potential 36 and node 37. The gate of transistor MN0 is coupled to a bias potential VbiasN, which helps establish a current level in the circuit. Transistors MN1 and MN2 are connected in series between the node 37 and LineP of the transmission line. Transistor MN3 is connected from the node between the transistors MN1 and MN2 to LineN of the transmission line. Transistors MN4 and MN5 are connected in series between the node 37 and LineN of the transmission line. Transistor MN6 is connected from the node between the transistors MN4 and MN5 to LineP of the transmission line.

Input data is applied as a differential signal including the positive polarity signal dP and negative polarity signal dN. Likewise, the input clock is applied as a differential signal, including the positive polarity signal clkP and the negative polarity signal clkN. The voltage dP is applied to the gate of transistor MP4 and the gate of transistor MN4. The voltage dN is applied to the gate of transistor MP1 and the gate of transistor MN1. The voltage clkP is applied to the gates of transistors MP2 and MP5, and to the gates of transistors MN2 and MN5. The voltage clkN is applied to the gates of transistors MP3 and MP6, and to the gates of transistors MN3 and MN6.

Figure 4:
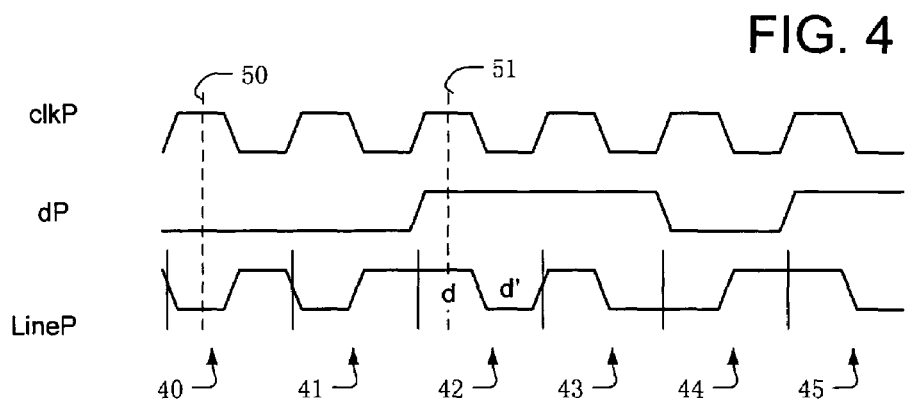
FIG. 4 is a timing diagram for signals in the circuit of FIG. 3.

Operation of the circuit shown in FIG. 3 can be understood with reference to the timing diagram in FIG. 4, showing six symbol cells 40-45, each of which includes a Manchester encoded symbol d-d' representing one bit of data from the input data stream. The signal levels d-d' indicate the value of the bit represented by each symbol cell. Only the positive polarity signals clkP, dP and LineP are illustrated in FIG. 4, because the negative polarity signals are simply complementary. The signals clkP and dP are typically full-swing signals. Although LineP is depicted for illustrative purposes in FIG. 4 with signal swings similar to those of clkP and dP, LineP can be a low swing signal that varies by only a few mV from the midpoint of the power supplies. With reference to the top subcircuit, when the signal clkP is high, and hence clkN is low, transistors MP2 and MP5 are on and transistors MP3 and MP6 are off. This results in the negative polarity signal dN controlling whether LineP is pulled up via transistors MP2, MP1 and MP0, and the positive polarity signal dP controlling whether LineN is pulled up via transistors MP5, MP4 and MP0. The complementary function is accomplished with the bottom subcircuit. Thus, as shown in FIG. 4, when the voltage clkP is high at cycle 50, and dP is low, LineN is pulled up via transistors MP5, MP4 and MP0, while LineP is pulled down via transistors MN2, MN1 and MN0. When clkP goes low during the next half of the symbol cell 40, LineN is pulled low via transistors MN3, MN1 and MN0, while LineP is pulled high via transistors MP6, MP4 and MP0. Thus, whenever dP is low (cells 40, 41 and 44), the symbol cell is encoded <01>, and the signal levels in the cell include a 0 to 1 transition. When dP is high (cells 42, 43 and 45), the opposite occurs.

Thus, at cycle 51 in cell 42, when clkP is high, and dP is high, LineP is pulled up via transistors MP2, MP1 and MP0, while LineN is pulled down via transistors MN5, MN4 and MN0. When clkP goes low during the next half of the symbol cell 42, LineP is pulled low via transistors MN6, MN4 and MN0, while LineN is pulled high via transistors MP3, MP1 and MP0. Thus, whenever dP is high (cells 42, 43 and 45), the cell is encoded <10>, and the signal levels in the cell include a 1 to 0 transition.

In representative embodiments, the complementary CMOS XOR/XNOR gate implemented by the circuit of FIG. 3 operates with a 5 gigahertz clock and drives a differential transmission line at 5 Gbps. Typical signaling current can be about 200 microamps for a 10 millivolts signal swing (5 millivolts on each of LineP and LineN), while the dP, dN, clkP and clkN signals are at substantially full logic levels (e.g. 1 Volt swing). The top and bottom subcircuits source and sink current into the transmission line. Since the voltage swing on the transmission line is very small, very little power is consumed, and the constant current sources are easy to implement. Also, feedback from the common mode voltage of the transmission line adjusts the LineP and LineN bias voltages to hold the common mode voltage mid-rail. The transistors MP0 and MN0 act as current tails limiting the current to these levels. Alternatively, the voltage of the data signals dP and dN can be controlled to set the current, effectively making the devices driven by these signals, MN1, MN4, MP1, and MP4, act as current sources. At these small current levels, the transistor sizes can be quite small, including transistors having gate widths for example on the order of a micron or less. The loads presented to the clock networks applying the clock signals clkP and clkN are likewise small, on the order of 10 femtoFarads (fF) per clock. Thus, the circuit shown in FIG. 3 operates with very low drive power (on the order of 200 microWatts), and uses a low power clock (10 to 100 microWatts).

The circuit shown in FIG. 3 would require that the dP and dN inputs change essentially instantaneously for proper operation at high speeds as contemplated herein. The circuit could be modified to overcome this requirement by generating two versions of the differential data signal, including a first version d1P and d1N valid during the clkN high phase and a second version dP2 and dN2 valid during the clkP high phase.

Figure 5:
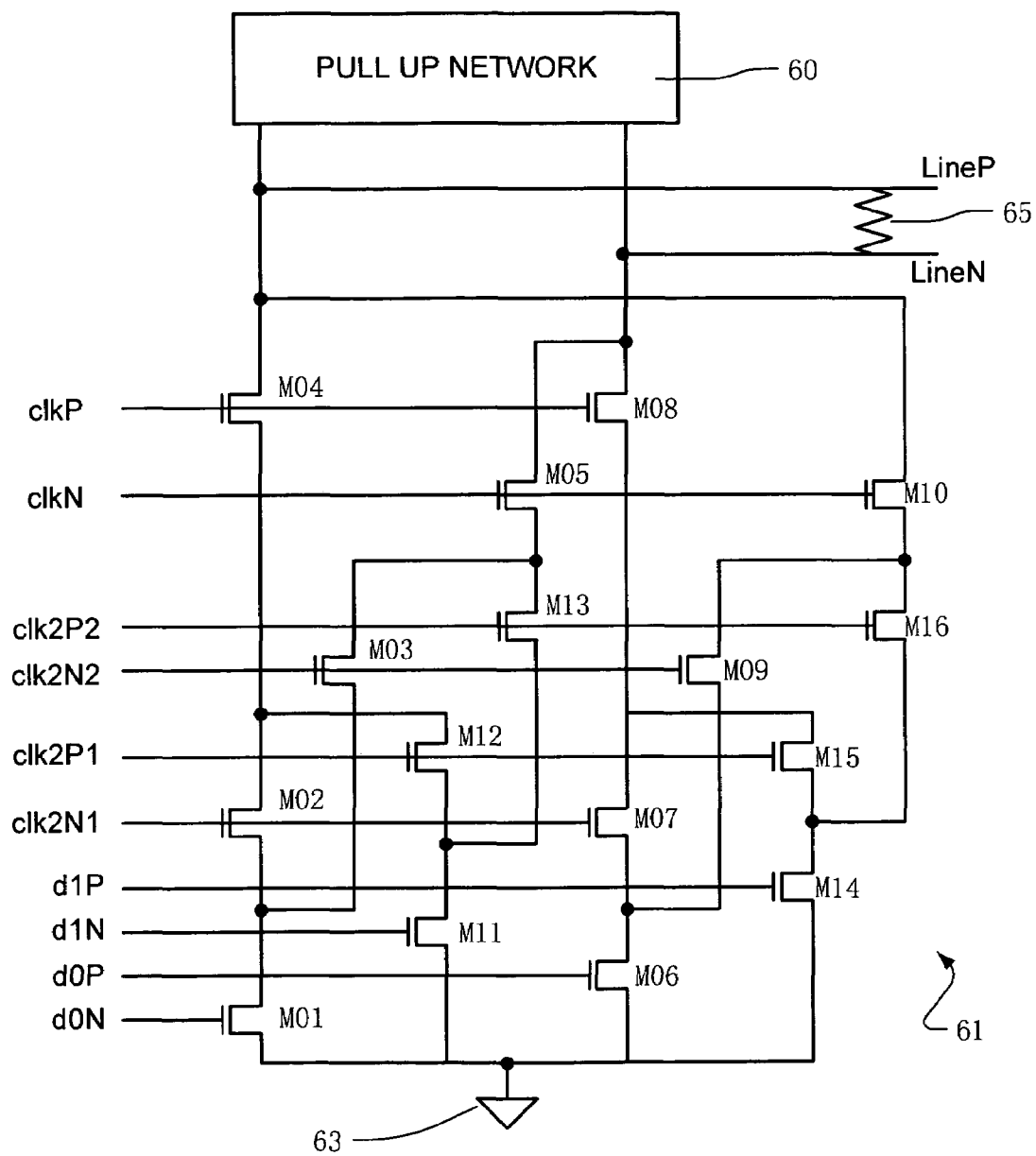
FIG. 5 is a circuit diagram for a high-speed, low power Manchester encoder/driver with 2:1 multiplexing.

Another alternative is illustrated in FIG. 5, which folds a 2:1 multiplexer into the decoder/driver circuit, which accepts as input two bits of data (d0N, d0P, d1N, d1P) and a four-phase half-bit-rate clock clk2 (clk2P2, clk2P1, clk2N2 and clk2N1), in addition to the transmit clock (clkP/clkN). The top subcircuit 60 comprises a pull-up network, which is a p-channel mirror of the illustrated bottom subcircuit 61, comprising an n-channel pull-down network including n-channel transistors M01 through M16. The subcircuit 60 operates to pull up the positive polarity line, LineP, and the negative polarity line, LineN, on the transmission line (proximal terminating resistor 65 is shown) while the pull-down network in the bottom subcircuit 61 pulls down the positive polarity line, LineP, and the negative polarity line, LineN, in response to the clock and data signals. The four-phase half-bit-rate clock cllk2 (clk2P2, clk2P1, clk2N2 and clk2N1) can be implemented on an integrated circuit with a quadrature divider, and arranged so that clk2P1 and clk2N1 change on the falling edge of clkP, so they are stable when clkP is high, and so that clk2P2 and clk2N2 change on the rising edge of clkP, so they are stable when clkP is low.

The bottom subcircuit 61 is described as follows. Transistors M01, M02 and M04 are connected in series between the ground terminal 63 and LineP. Transistor M03 and transistor M05 are connected in series from the node between transistors M01 and M02 to LineN. Transistors M06, M07 and M08 are connected in series between the ground terminal 63 and LineN. Transistor M09 and transistor M10 are connected in series from the node between transistors M06 and M07 to LineP. Transistors M11 and M12 are connected in series from the ground terminal 63 to the node between transistors M02 and M04. Transistor M13 is connected from the node between transistors M11 and M12 to the node between transistors M03 and M05. Transistors M14 and M15 are connected in series between the ground terminal 63 and the node between transistors M07 and M08.

Transistor M16 is coupled from the node between transistors M14 and M15 to the node between transistors M09 and M10.

The negative polarity signal d0N for the first data signal is applied to the gate of transistor M01. The positive polarity signal d0P for the first data signal is applied to the gate of transistor M06. The negative polarity signal d1N for the second data signal is applied to the gate of transistor M11. The positive polarity signal d1P for the second data signal is applied to the gate of transistor M14. The positive polarity signal clkP for the transmit clock is applied to the gates of transistors M04 and M08. The negative polarity signal clkN for the transmit clock is applied to the gates of transistors M05 and M10. The negative polarity signal clk2N1 for the first half-bit-rate clock is applied to the gates of transistors M02 and M07. The positive polarity signal clk2P1 for the first half-bit-rate clock is applied to the gates of transistors M12 and M15. The negative polarity signal clk2N2 for the second half-bit-rate clock is applied to the gates of transistors M03 and M09. The positive polarity signal clk2P2 for the second half-bit-rate clock is applied to the gates of transistors M13 and M16.

Figure 6:
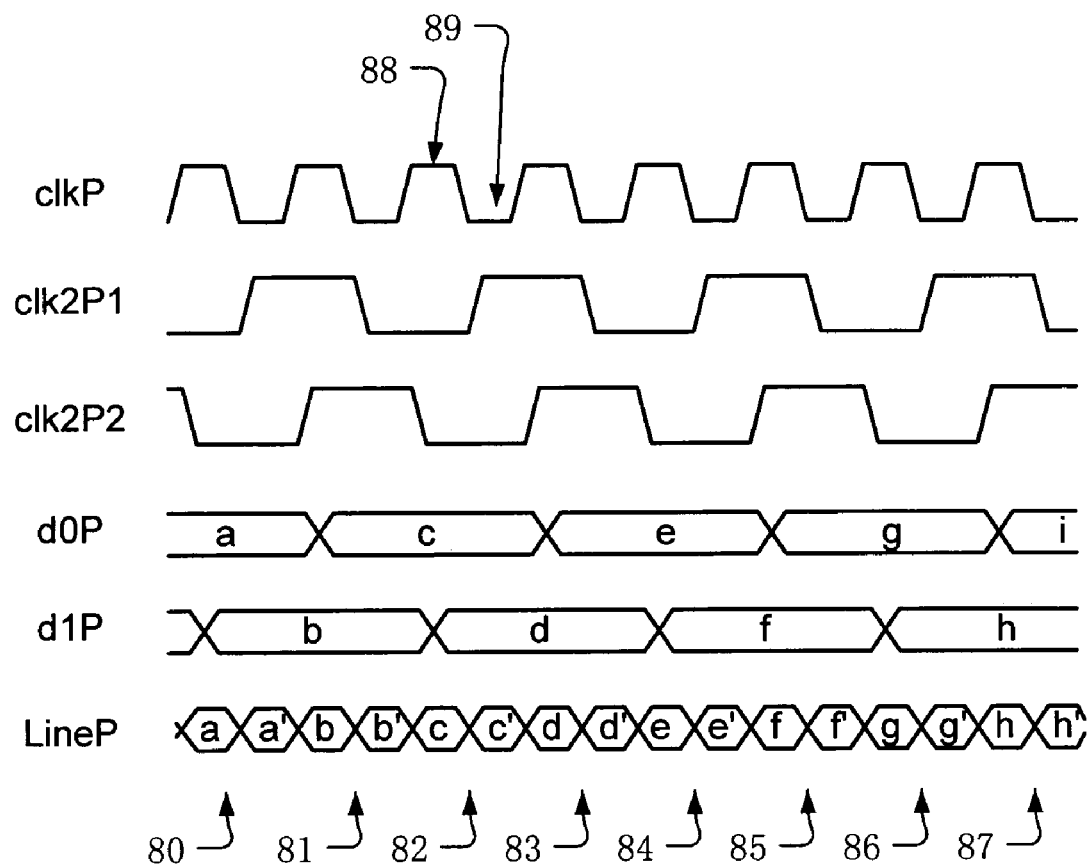
FIG. 6 is a timing diagram for signals in the circuit of FIG. 5.

Operation of the circuit shown in FIG. 5 can be understood with reference to the timing diagram shown in FIG. 6, showing eight symbol cells 80-87, each of which includes a Manchester encoded data symbol (a-a', b-b', c-c', d-d', e-e', f-f', g-g', h-h') corresponding to the data values a, c, e, g applied on the first data input d0P, and data values b, d, f, h applied on the second data input d1P, and including a transition that indicates the value of the data. Only the positive polarity signals clkP, clk2P1, clk2P2, d0P, d1P and LineP are illustrated in FIG. 6, because the negative polarity signals are simply complementary. During a representative cell, such as cell 82, the data value c from the input d0P is transmitted by the circuit as the signal levels c-c'. During the first half of cell 82 at time 88 in FIG. 6, the transmit clock clkP is high, the clock signal clk2P1 is low and the clock signal clk2P2 is low. In this condition of the clock signals, transistors M04 and M08 are on and transistors M05 and M10 are off due to clkP. Transistors M12 and M15 are off and transistors M02 and M07 are on due to clk2P1. Transistors M03 and M09 are on and transistors M13 and M16 are off due to clk2P2. This forms a current path through transistors M01, M02 and M04 to pull down LineP if the data value c is low (d0N high), and a current path through transistors M06, M07 and M08 to pull down LineN if the data value c is high (d0P high).

During the second half of cell 82 at time 89 in FIG. 6, the transmit clock clkP is low, the clock signal clk2P1 is high and the clock signal clk2P2 is low. In this condition of the clock signals, transistors M04 and M08 are off and transistors M05 and M10 are on due to clkP (clkN is high). Transistors M12 and M15 are on and transistors M02 and M07 are off due to clk2P1. Transistors M13 and M16 are off and transistors M03 and M09 are on due to clk2P2. This forms a current path through transistors M01, M03 and M05 to pull down LineN if the data value c is low (d0N high), and a current path through transistors M06, M09 and M110 to pull down LineP, if the data value c is high (d0P is high).

In the next cycle of the transmit clock for symbol cell 83, current paths from M01 and M06 are disabled, and current paths from M11 and M14 are enabled in a manner like that described above, to drive a Manchester encoded data symbol d-d' on the transmission line, representing data value d from the input d1P.

The circuit of FIG. 5, combining a multiplexer into the encoder/driver has the advantage of further reducing power consumption, because the data signal dP/dN is never realized as a full swing voltage-mode signal. Rather, it exists only as a current mode signal in the pull-up and pull-down networks. In other embodiments, a larger input multiplexer (for example a 4:1 or a 8:1 multiplexer), or other types of logic, can be included in the driver in a similar manner, so long as they do not become too large and slow to operate at full rate.

Figure 11:
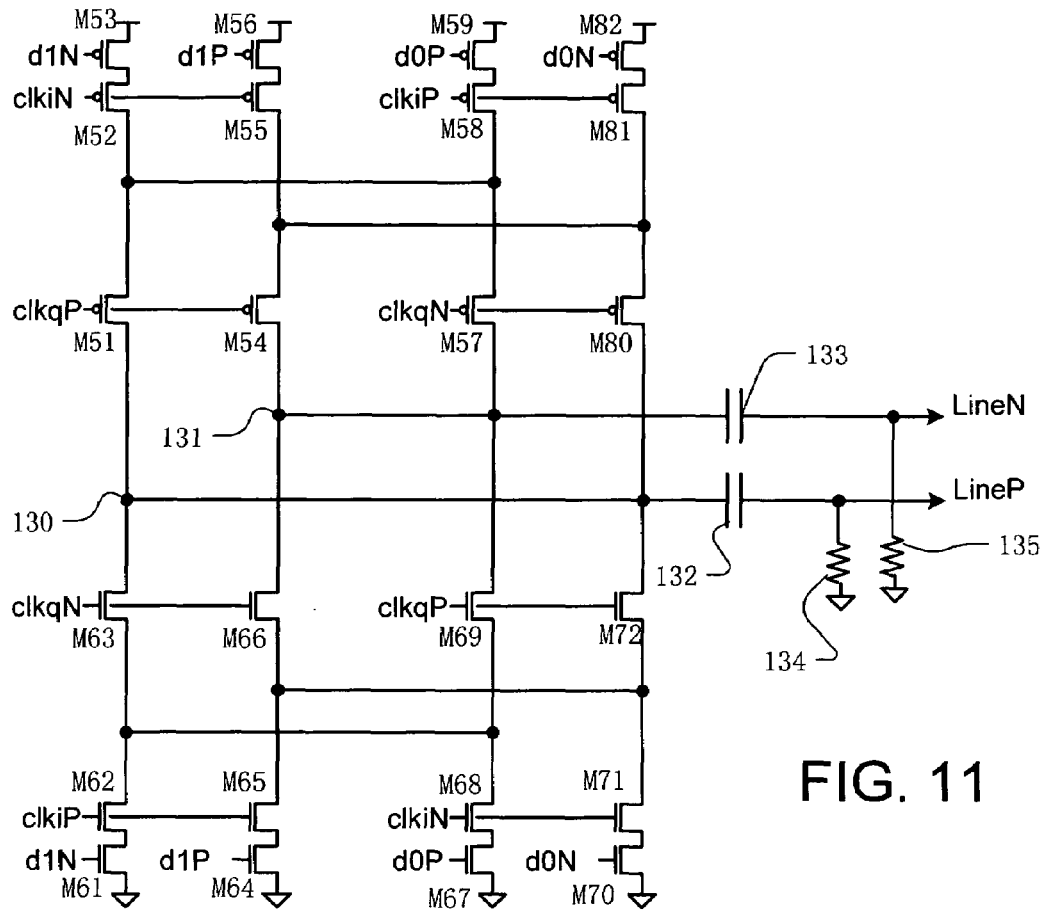
FIG. 11 is a circuit diagram for a high-speed, low power Manchester encoder/driver with 2:1 multiplexing using quadrature, half-speed clocks.
Figure 12:
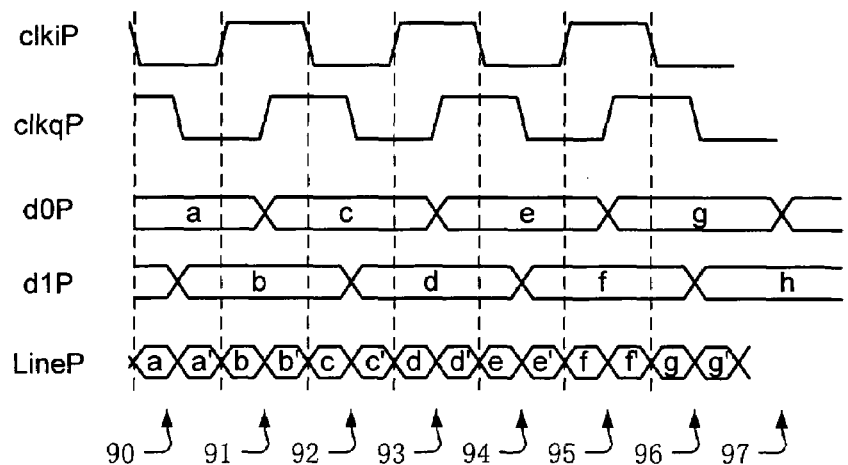
FIG. 12 is a timing diagram for signals in the circuit of FIG. 11.

The transmitter described with reference to FIGS. 5 and 6 utilizes a full speed clock. An alternative transmitter is shown in FIGS. 11 and 12, which does not require a full speed clock. Rather, the transmitter of FIGS. 11 and 12 requires two quadrature half-frequency clocks clkiP/clkiN and clkqP/clkqN, and is implemented with fewer devices. The pull-down network in the circuit of FIG. 11 includes n-channel transistors M61 to M72. Transistors M61, M62 and M63 are connected in series between ground and node 130. Transistors M64, M65 and M66 are connected in series between ground and node 131. Transistors M67, M68 and M69 are connected in series between ground and node 131. Transistors M70, M71 and M72 are connected in series between ground and node 130. The data input d1N is connected to the gate of transistor M61. The data input d1P is connected to the gate of transistor M64. The data input d0P is connected to the gate of transistor M67. The data input d0N is connected to the data transistor M70. The positive polarity "in-phase" clock clkiP is connected to the gates of transistors M62 and M65. The negative polarity "in-phase" clock clkiN is connected to the gates of transistors M68 and M71. The negative polarity "quadrature" clock clkqN is connected to the gates of transistors M63 and M66. The positive polarity "quadrature" clock clkqP is connected to the gates of transistors M69 and M72. The drains of transistors M62 and M68 are connected together. The drains of transistors M65 and M71 are connected together.

The pull-up network in the circuit of FIG. 11 includes p-channel transistors M51 to M59, and M80 to M82. Transistors M51, M52 and M53 are connected in series between node 130 and the supply voltage. Transistors M54, M55 and M56 are connected in series between node 131 and the supply voltage. Transistors M57, M58 and M59 are connected in series between node 131 and the supply voltage. Transistors M80, M81 and M82 are connected in series between node 130 and the supply voltage. The data input d1N is connected to the gate of transistor M53. The data input d1P is connected to the gate of transistor M56. The data input d0P is connected to the gate of transistor M59. The data input d0N is connected to the data transistor M82. The positive polarity "in-phase" clock clkiP is connected to the gates of transistors M58 and M81. The negative polarity "in-phase" clock clkiN is connected to the gates of transistors M52 and M55. The negative polarity "quadrature" clock clkqN is connected to the gates of transistors M57 and M80. The positive polarity "quadrature" clock clkqP is connected to the gates of transistors M51 and M54. The drains of transistors M52 and M58 are connected together. The drains of transistors M55 and M81 are connected together.

Node 130 is coupled via capacitor 132 to the negative polarity part LineN of the transmission line, and node 131 is coupled via capacitor 133 to the positive polarity part LineP of transmission line. Resistors 134 and 135 are connected between LineN and ground and LineP and ground, respectively. This arrangement, as an alternative to the termination resistor 65 of FIG. 5, differentiates voltage ramps produced by the pull-down and pull-up networks, and produces a fast-rise-time encoded voltage signal on the transmission line. In an embodiment with about one mW of power, the differential voltage swing on the transmission line is about 20 millivolts. The signal is inherently equalized, since the coupling network provided by the capacitors 132 and 133, and the resistors 134 and 135, introduces a zero in the overall link transfer function. This zero can be adjusted to some degree, in order to compensate for high-frequency attenuation in the channel. This arrangement also simplifies electrostatic discharge ESD protection requirements. An ESD system that protects the transmitter for the embodiment of FIG. 11 needs to protect the coupling capacitors, and can have a higher clamp voltage than would be required for a transmitter like that described with reference to FIG. 7.

Operation of the circuit shown in FIG. 11 can be understood with reference to the timing diagram shown in FIG. 12, showing eight symbol cells 90-97, each of which includes a Manchester encoded data symbol (a-a', b-b', c-c', d-d', e-e', f-f', g-g', h-h') corresponding to the data values a, c, e, g applied on the first data input d0P, and data values b, d, f, h applied on the second data input d1P, and including a transition that indicates the value of the data. Only the positive polarity signals clkiP, clkqP, d0P, d1P and LineP are illustrated in FIG. 12, because the negative polarity signals are simply complementary. During a representative cell, such as cell 92, the data value c from the input d0P is transmitted by the circuit as the signal levels c-c'. During the first half of cell 92, the "in-phase" transmit clock clkiP is low, and the "quadrature" transmit clock clkqP is high. In this condition of the clock signals, transistors M68 and M69 and transistors M71 and M72 are on due to clkiN and clkqP, while transistors M62 and M63 and transistors M65 and M66 are off due to clkiP and clkqN. This forms a current path through transistors M67, M68 and M69 to pull down node 131 (LineN) if the data value c is high (d0P high), and a current path through transistors M70, M71 and M72 to pull down node 130 (LineP) if the data value c is low (d0P low).

During the second half of cell 92 in FIG. 6, the transmit clock clkiP remains low, and the clock signal clkqP is low. In this condition of the clock signals, transistors M69 and M72 are off and transistors M63 and M66 are on due to clkqN. This forms a current path through transistors M67, M68 and M63 to pull down node 130 (LineP) if the data value c is high (d0P high), and a current path through transistors M70, M71 and M66 to pull down node 131 (LineN), if the data value c is low (d0P is low). The pull-up network operates in a symmetrical fashion, which in combination with the pull-down network drives a Manchester encoded signal on the transmission line (LineP/LineN).

Figure 7:
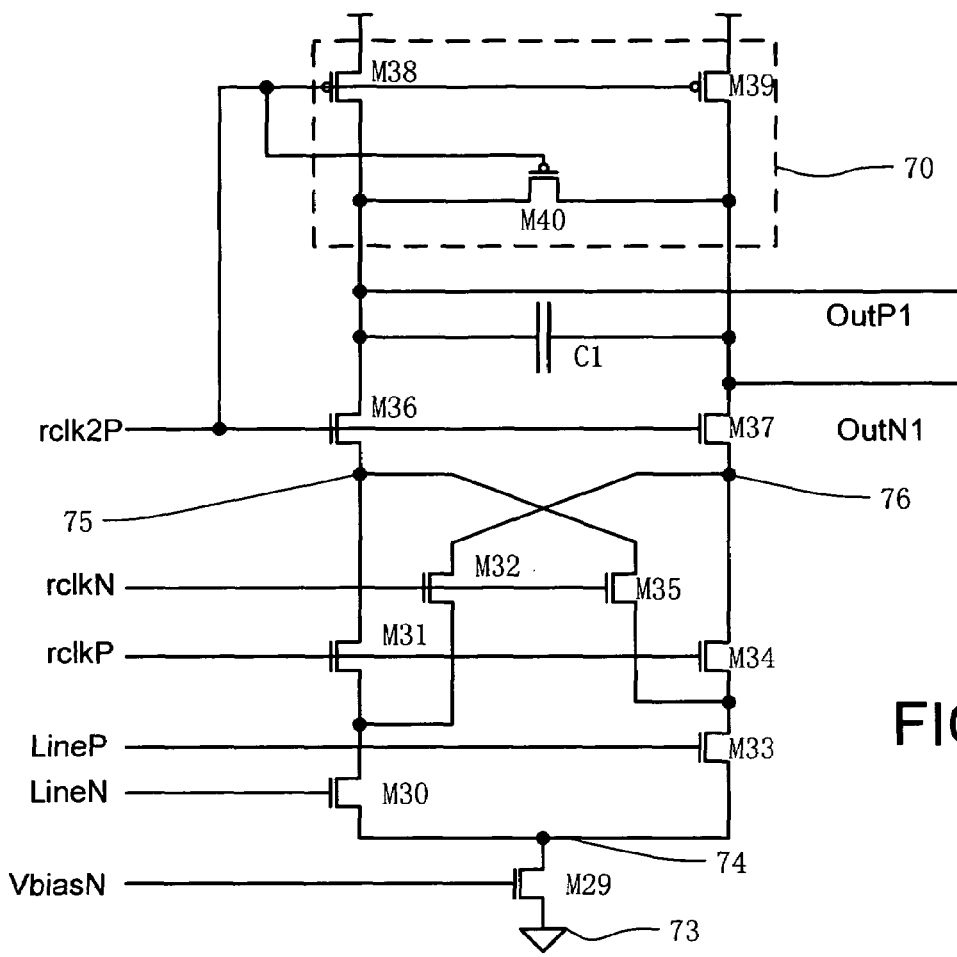
FIG. 7 is a circuit diagram for a high-speed, low power integrator circuit for an integrating receiver.

A low-voltage sequence of signal levels representing a Manchester encoded symbol can be detected by an integrating receiver that flips the polarity of its integration mid-cell. A representative embodiment of an integrator circuit suitable for use in implementing this type of receiver is illustrated in FIG. 7. Two copies of the integrator circuit shown in FIG. 7 are needed, operating in a ping-pong fashion so that one precharges while the other integrates one bit from the transmission line. During the first half of a symbol cell, the differential line voltage is integrated onto the storage capacitor C1. During the second half of the symbol cell, the negated line voltage is integrated. In a Manchester encoded signal, the duty factor is balanced, and fixed offsets in the system are canceled by this integration. Canceled noise sources include input offset in the input pair, as well as any low-frequency noise in the input line.

The integrator circuit includes a precharge circuit 70 that is coupled to positive and negative polarity output lines OutP1 and OutN1. A capacitor C1, implemented using inherent capacitance in the circuit, or using a discrete component, is coupled between the lines OutP1 and OutN1. N-channel CMOS transistors M29-M37, are arranged to control the integrator, in response to differential receiver clock signals rclkP/rclkN, the half frequency clock rclk2P, and the input signal LineP/LineN on the transmission line. Transistor M29 is coupled between ground 73 and node 74. Transistors M30 and M31 are connected in series between node 74 and node 75, and via transistor M36 to output line OutP1. Transistors M33 and M34 are connected in series between node 74 and node 76, and via transistor M37 to output line OutN1. Transistor M32 is connected from the node between transistors M31 and M30 to node 76, and via transistor M37 to output line OutN1. Transistor M35 is connected from the node between transistors M33 and M34 to node 75, and via transistor M36 to output line OutP1. The precharge circuit 70 in the illustrated embodiment includes p-channel transistors M38-M40. Transistor M38 is coupled between the output line OutP1 and the supply voltage, transistor M3.9 is coupled between the output line OutN1 and the supply voltage, and transistor M40 ties the output lines OutP1 and OutN1 together during a precharge cycle. The precharge cycle is controlled by the half frequency clock rclk2P signal applied to the gates of p-channel transistors M38-M40, and to the gates of n-channel transistors M36 and M37. When rclk2P is high, transistors M38-M40 are off, and transistors M36 and M37 are on, enabling the integrator. When rclk2P is low, transistors M38-M40 are on and transistors M36 and M37 are off, disabling the integrator and equalizing the voltages on either side of the capacitor C1. The negative polarity receiver clock signal rclkN is applied to the gates of transistors M32 and M35. The positive polarity receiver clock signal rclkP is applied to the gates of transistors M31 and M34. The positive polarity signal LineP from the transmission line is applied to the gate of transistor M33. The negative polarity signal LineN from the transmission line is applied to the gate of transistor M30. A bias voltage VbiasN is applied to the gate of transistor M29, to control the magnitude of the current in the integrator.

Figure 8:
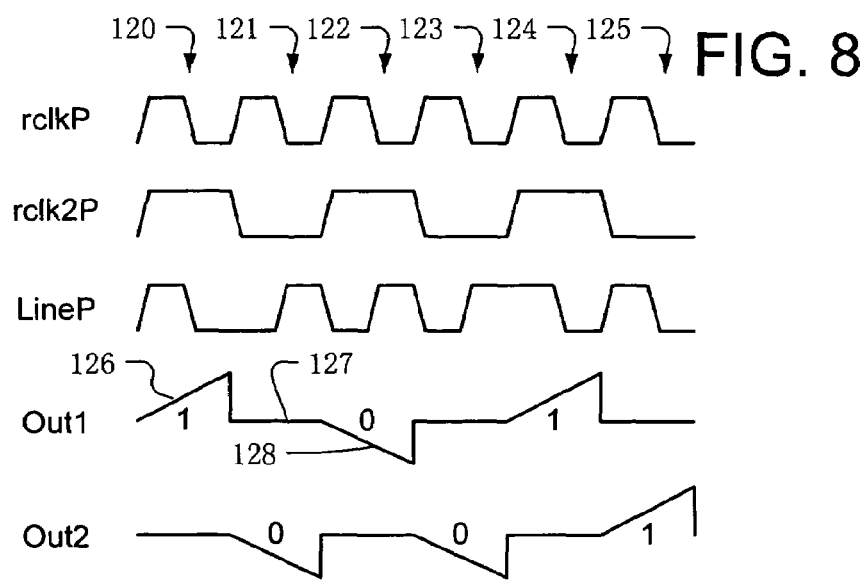
FIG. 8 is a timing diagram for signals in the circuit of FIG. 7.

Operation of the circuit in FIG. 7 can be understood with reference to the timing diagram in FIG. 8. Only the positive polarity signals rclk2P, rclkP and LineP are shown from FIG. 7, because the negative polarity signals are simply complementary. The output Out1 represents the voltage difference between OutP1 and OutN1. The output Out2 is also shown, which represents the output from the second integrator circuit that operates while the first is precharging.

As can be seen, six symbol cells 120-125 are shown. During symbol cells 120, 122, and 124, the integrator is enabled by a high level on rclk2P. During a first interval in cell 120 the receive clock signal rclkP has a high value and during a second interval in symbol cell 120, the receive clock signal rclkP has a low value. The first interval is equal to the first half of the symbol cell and the second interval is equal to the second half of the cell, in this example. Transistors M31 and M34 are on in the first interval, while transistors M32 and M35 are off. Since the voltage LineP is high in the first interval, the transistor M33 is on, and the transistor M30 is off. Thus, the output OutN1 is pulled down, inducing a positive slope voltage ramp 126 in Out1. During the second interval of symbol cell 120, the clock signal rclkP and the data signal LineP are low, and therefore transistors M30 and M32 are on, while transistors M31 and M33 are off. This creates pull-down current path through transistor M30 and transistor M32 to output OutN1, maintaining the positive slope voltage ramp 126 in Out1. During the next symbol cell 121, the output Out1 is precharged to the starting level 127.

In the third symbol cell 122, the data symbol is reflected as a <01> code word, with a low to high transition in the middle of the symbol cell 122. Thus, transistors M31 and M34 are on in the first interval, while transistors M32 and M35 are off. The data signal LineP is low in the first half cycle, so the transistor M33 is off, and the transistor M30 is on. Thus, the output OutP1 is pulled down via transistors M30 and M31, inducing a negative slope voltage ramp 128 in Out1. During the second interval, the receive clock rclkP has a low value. Thus, transistors M32 and M35 are on, while transistors M31 and M34 are off. With LineP high during the second interval of symbol cell 122, transistor M30 is off and transistor M33 is on. This creates pull-down current paths through transistor M33 and transistor M35 to output OutP1, maintaining the negative slope voltage ramp 128 in Out1.

Figure 9:
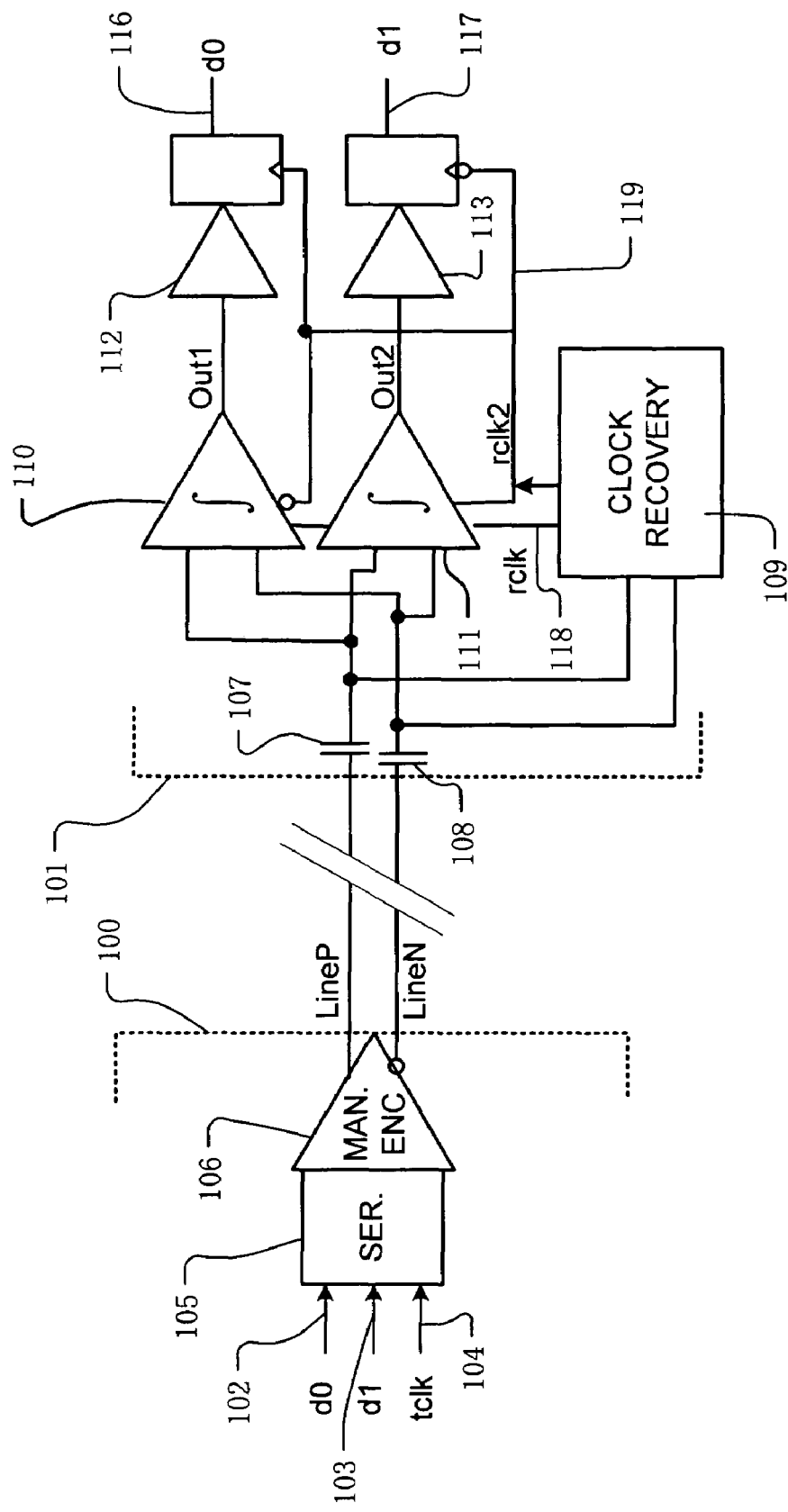
FIG. 9 is a simplified diagram of a communication channel including a Manchester encoder/driver with a serializer, and an integrating receiver and demultiplexer.

During symbol cells 121, 123 and 125, a second integrator, enabled by the inverse of rclk2P, produces Out2, in response to LineP and LineN, and can be configured as shown in FIG. 9.

An alternative integrator is described with reference to FIGS. 13 and 14. This alternative does not require a full speed clock. Rather, the integrator of FIGS. 13 and 14 requires two quadrature half-frequency clocks clkiP/clkiN and clkqP/clkqN. The integrator includes a precharge circuit and an integrating circuit. The precharge circuit comprises p-channel transistors M94, M99 and M100. The integrating circuit comprises n-channel transistors M89-M93 and M95-M98. The integrating circuit produces an output on the differential lines OutP1 and OutN1 that are connected to the nodes 145 and 146 on opposite terminals of the capacitor C13. The results of the integrating circuit are developed in response to the level of the data signals on the transmission line LineP/LineN.

Transistor M94 in the precharge circuit is connected between node 145 and the supply voltage. Transistor M99 is connected between node 146 in the supply voltage. Transistor M100 is connected between nodes 145 and 146. The gates of transistors M94, M99 and M100 in the precharge circuit are connected to the "in-phase" clock signal clkiP, and operate to equalize the voltage across the capacitor when clkiP is low. When clkiP is high, the integrating circuit is enabled.

Transistor M89 in the integrating circuit is connected between ground and node 144, and has its gate coupled to a reference voltage VbiasN, and acts as current regulator for the integrator. Transistors M90, M91 and M92 are connected in series between the node 144 and the node 145 on which the signal OutP1 is produced. Transistors M95, M96 and M97 are connected in series between the node 144 and the node 146 on which the signal OutN1 is produced. Transistor M93 is connected from the node between transistors M91 and M92 to node 146. Transistor M98 is connected from the node between transistors M96 and M97 to node 145. The gate of transistor M90 is connected to the input LineN. The gate of transistor M95 is connected to the input LineP. The gates of transistors M91 and M96 are connected to the "in-phase" clock signal clkiP. The gates of transistors M92 and M97 are connected to the "quadrature" clock signal clkqN. The gates of transistors M93 and M98 are connected to the "quadrature" clock signal clkqP.

Figure 13:
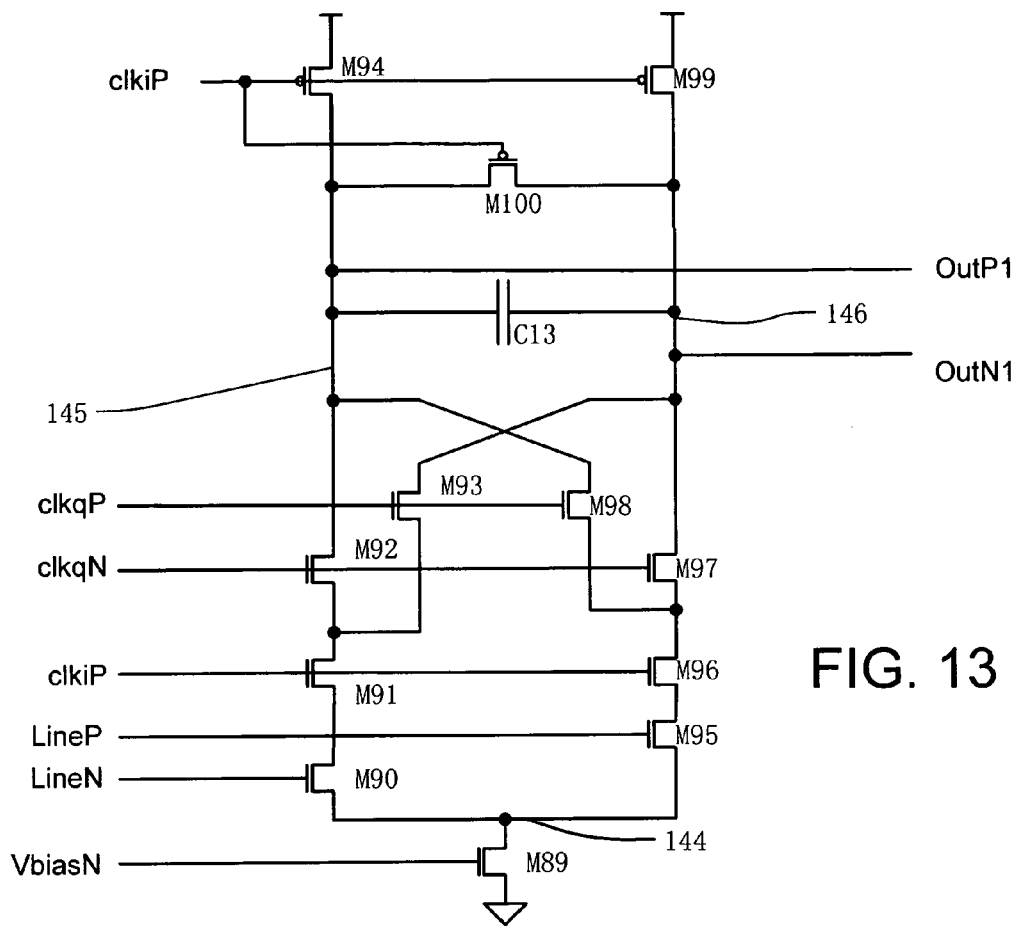
FIG. 13 is a circuit diagram for a high-speed, low power integrator circuit for an integrating receiver using quadrature, half-speed clocks.
Figure 14:
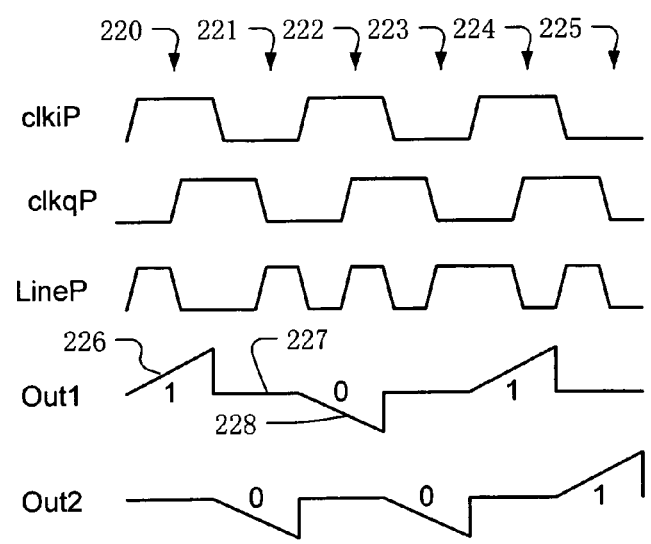
FIG. 14 is a timing diagram for signals in the circuit of FIG. 13.

Operation of the circuit in FIG. 13 can be understood with reference to the timing diagram in FIG. 14. Only the positive polarity signals clkiP, clkqP and LineP are shown from FIG. 13, because the negative polarity signals are simply complementary. The output Out1 represents the voltage difference between OutP1 and OutN1. The output Out2 is also shown, which represents the output from the second integrator circuit that operates while the first is precharging.

As can be seen, six symbol cells 220-225 are shown. During symbol cells 220, 222, and 224, the integrator is enabled by a high level on clkiP. In the first symbol cell 220, the data code word is <10>. During a first interval in cell 220 the "in phase" clock signal clkiP has a high value and the "quadrature" clock signal clkqP has a low value. During a second interval in symbol cell 220, both the "in phase" clock signal clkiP and the "quadrature" clock signal clkqP have" a high value. The first interval is equal to the first half of the symbol cell and the second interval is equal to the second half of the cell, in this example. Transistors M91, M92, M96 and M97 are on in the first interval, while transistors M93 and M98 are off. Since the voltage LineP is high in the first interval, the transistor M95 is on, and the transistor M90 is off. Thus, the output OutN1 is pulled down, inducing a positive slope voltage ramp 226 in Out1. During the second interval of symbol cell 220, the transistors M93 and M98 are on, while transistors M92 and M97 are off. Line P goes low in the second interval, creating pull-down current path through transistor M90, transistor M91, and transistor M93 to output OutN1, maintaining the positive slope voltage ramp 226 in Out1. During the next symbol cell 221, the output Out1 is precharged to the starting level 227.

In the third symbol cell 222, the data symbol is reflected as a <01> code word, with a low to high transition in the middle of the symbol cell 222. Thus, data signal LineP is low in the first half cycle, so transistors M90 and M91 are on in the first interval, while transistor M95 is off. Thus, the output OutP1 is pulled down via transistor M92, inducing a negative slope voltage ramp 228 in Out1. During the second interval, LineP is high, so transistor M90 is off and transistor M95 is on. This creates a pull-down current path through transistor M98 to output OutP1, maintaining the negative slope voltage ramp 228 in Out1.

During symbol cells 221, 223 and 225, a second integrator enabled by the inverse of clkiP/clkiN and clkqP/clkqN, produces Out2 in response to LineP and LineN, and can be configured as shown in FIG. 9.

FIG. 9 is a simplified block diagram of a communication channel utilizing a combined multiplexer/encoder/driver like that shown in FIG. 5, and an integrating receiver utilizing integrator circuits like that described with respect to FIG. 7. In the illustrated embodiment, the channel provides communication between integrated circuit 100 and integrated circuit 101. Core circuitry on integrated circuit 100 provides input data d0 and d1 in parallel, and a transmit clock tclk, on lines 102, 103 and 104, respectively, to a transmitter, including circuits (conceptually 105) for serializing the data d0 and d1, and circuits (conceptually 106) for encoding and driving a differential transmission line, including positive polarity line LineP and negative polarity line LineN.

LineP and LineN of the transmission line are coupled to an input on integrated circuit 101, via a capacitive coupling circuit represented by capacitor symbols 107, 108 in the illustrated embodiment. In a Manchester encoded signal, or other similarly band-limited signal, the input can be AC coupled via the capacitive coupling circuit 107, 108, allowing a DC bias level on the inputs to the components on the integrated circuit 101 to be set independent of the common mode voltage on the transmission line LineP, LineN.

The capacitively coupled signals are applied to a clock recovery circuit 109 and to ping-pong integrators 110, 111. Integrator 110 is precharged while rclk2 is high and integrates while rclk2 is low, while integrator 111 is precharged while rclk2 is low and integrates while rclk2 is high. The outputs Out1 and Out2 of the integrators 110, 111 are applied to sense amplifiers 112, 113, implemented for example, using clocked differential amplifiers that detect the polarity of the outputs of the integrators 110, 111. on the rising and falling edges of the rclk2 clock, respectively. The recovered data d0, d1 is applied on lines 116 and 117 to core circuitry on integrated circuit 101.

The clock recovery circuit 109 produces a receive clock rclk on line 118 that is applied to the integrators 110, 111, and the half frequency clock rclk2 on line 119, that is applied to the integrators 110, 111 and to the clocked sense amplifiers 112, 113. Clock recovery circuits for Manchester encoded data, or other combined clock and data encoded signals can be implemented in a number of known ways. In one embodiment, since a Manchester encoded signal includes a transition in each bit cell, it is used to directly recover the clock by rectifying the signal to eliminate the sign of the transition, and pumping an oscillator with the resulting signal. Such rectification can be performed by transistors in a pull-down network, with a replica bias set to the zero level.

In an alternative, the clock recovery circuit can be based on phase error tracking circuits, where the edge of each bit cell can be used to give a proportional measure of phase error. For example, an integrating amplifier gated by a half-rate clock can be used to generate the signal indicating phase error. When the signal is in lock, the two halves of the bit always sum to zero. When the signal is early, the results of integration will be positive for a logic one bit and negative for a logic zero bit. For an early signal, the circuit will integrate part of the previous bit. Conversely, when the signal is late, the results of integration will be negative for a logic one bit and positive for a logic zero bit. For a late signal, the circuit will integrate part of the next bit. This approach to measuring phase error will give zero as a result for repeated bits, so the circuit will only give phase error signals on bit transitions. This limitation could be overcome by generating a clock signal that integrates only a fraction (for example, one half) of the bit period centered on the middle of the bit period.

At the end of a bit period, the integrating phase detector generates a proportional phase error signal. The signal is stored on a capacitor, or otherwise, until the value of the bit is determined and summed onto a cumulative error capacitor. The summing may be in either direction, depending on the value of the current bit. The result of the accumulated phase error can be used to control a phase locked loop PLL or a delay locked loop DLL. In the DLL example, when the accumulated phase error reaches a threshold, the phase counter of the DLL is stepped, and the error is reset. The phase counter in turn controls a phase error interpolator such as an injection locked oscillator ILO coupled to the input clock, where a phase of the coupling is varied to rotate the receiver clock rclk phase. An analog phase error tracking circuit, such as just described, minimizes the use of high-speed digital logic in the circuit, and conserves power.

Figure 15:
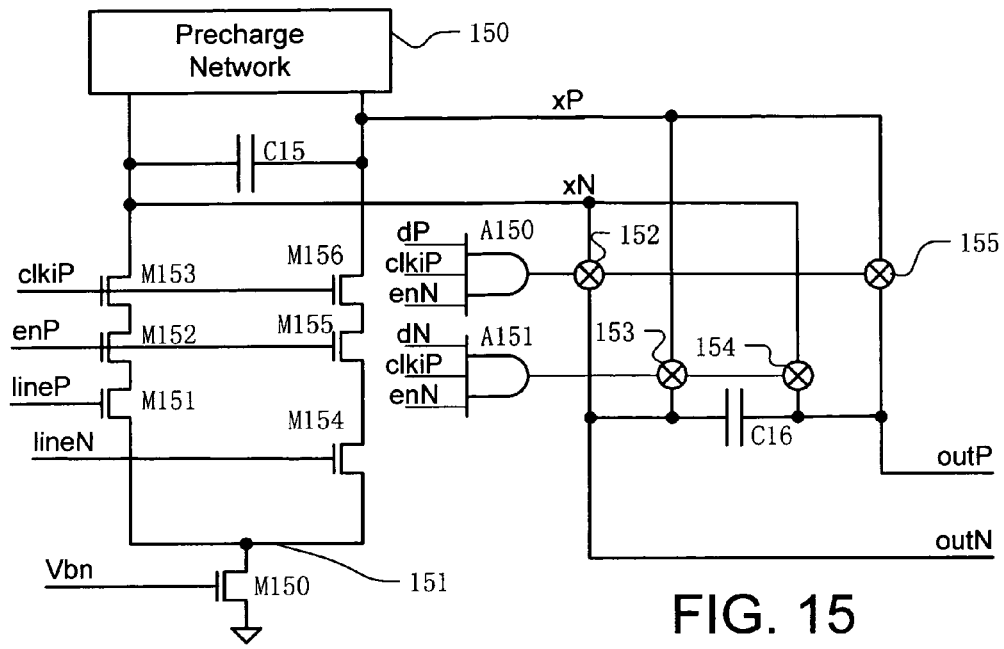
FIG. 15 is a simplified diagram of a phase detector for use in clock recovery suitable for use with receivers described above.
Figure 16:
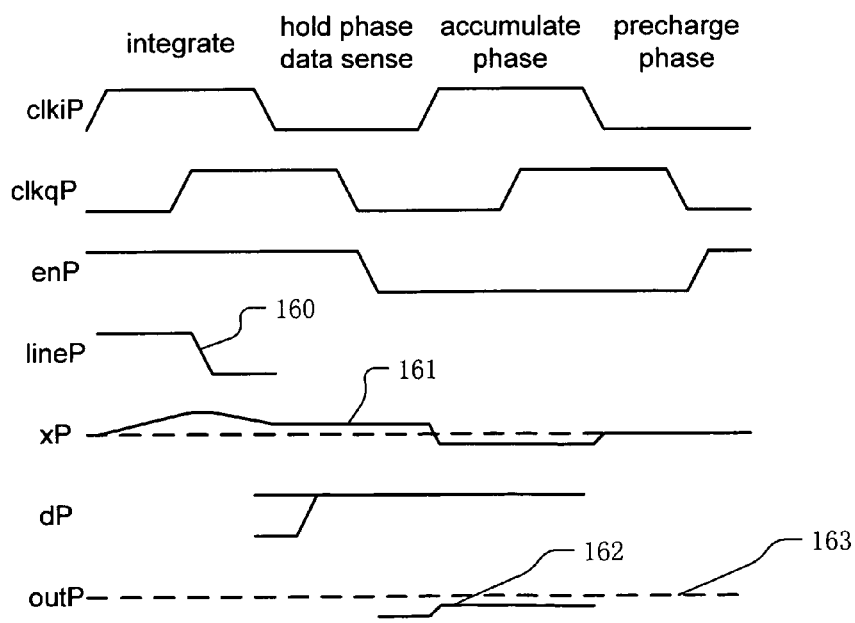
FIG. 16 is a timing diagram for signals in the circuit of FIG. 15.

One embodiment of an analog phase error tracking circuit is described with reference to FIGS. 15 and 16. The phase error tracking circuit includes a precharge network 150, n-channel transistors M150 to M156, transmission gates 152-155, and capacitors C15 and C16. Transistor M150 is connected between ground and node 151. The gate of transistor M150 is connected to a reference voltage Vbn, and regulates current. Transistors M151, M152 and M153 are connected in series between node 151 and a first terminal on capacitor C15, at which the signal xN is developed. Transistors M154, M155 and M156 are connected in series between node 151 and a second terminal on capacitor C15, at which the signal xP is developed. The precharge circuit is coupled across the first and second terminals of the capacitor C15. The gate of transistor M151 is connected to the input lineP. The gate of transistor M154 is connected to the input lineN. The gates of transistors M152 and M155 are connected to the control signal enP. As can be seen in FIG. 16, the control signal enP is generated by dividing frequency of the "quadrature" clock signal clkqP by two. The gates of transistors M153 and M156 are connected to the clock signal clkiP. Outputs outN and outP of the circuit are developed across the first and second terminals, respectively, of capacitor C16.

Transmission gate 152 is connected between the first terminal (xN) of capacitor C15 and the first terminal (outN) of capacitor C16. Transmission gate 153 is connected between the second terminal (xP) of capacitor C15 and the first terminal (outN) of capacitor C16. Transmission gate 154 is connected between the first terminal (xN) of capacitor C15 and the second terminal (outP) of capacitor C16. Transmission gate 155 is connected between the second terminal (xP) of capacitor C15 and the second terminal (outP) of capacitor C16. Transmission gate 152 and transmission gate 155 are enabled by the output of AND gate A150 which forms the logical AND of the sensed output data dP, the in-phase clock clkiP, and the complement of the control signal, enN. Transmission gate 153 and transmission gate 154 are enabled by the output of AND gate A151 which forms the logical AND of the sensed output data dN, the in-phase clock clkiP, and the complement enN of the control signal enP.

As can be seen with reference to FIG. 16, the circuit operates in four phases: (1) integrate, (2) hold phase—data sense, (3) accumulate phase, (4) a precharge phase. During the first phase, transistors M152, M153, M155 and M156 are on, and the phase comparator integrates the signal lineP/lineN on the line for the duration of the clkiP signal, to produce a voltage xP and xN across the capacitor C15. Ideally one would use a slightly foreshortened version of this clkiP signal, but that is not essential. In parallel with this circuit integrating the "phase," a data receiver as described above integrates the data symbol on lineP (flipping polarity in the middle of the cell at point 160). During the second phase (clkiP is low turning off transistors M153 and M156), this circuit simply holds its output while the data receiver senses its output value. During the third phase, transistors M152 and M155 are off due to enP, and the charge on capacitor C15 integrated by this circuit is accumulated on capacitor C16, with the polarity of the accumulation on C16 being determined by the value of the data bit dP/dN via AND gates A150 and A151 and the transmission gates 152-155. Finally, during the last phase, the circuit is precharged to prepare it for the next phase sample. To sample every bit, four copies of the circuit are needed. However, one could get by with sampling only every other or every fourth bit.

In the example shown in FIG. 16, a "1" symbol that is slightly late (and preceded by a "0" symbol) is integrated. This results in sense node xP (really the difference between xP and xN) being left slightly positive at point 161. The value on xP is held during the sense phase while the data bit dP is determined. Once dP is determined it is used to steer the charge on xP onto the accumulation capacitor. In this case, the bit is a "1," so xP is directly dumped onto outP, resulting in an increase in the level of outP at point 162. If a "0" were detected, the polarity would be flipped before accumulation. In this case a slightly "late" indication on xP is dumped onto an "early" accumulation (indicated by the level of outP being below the line 163) on outP resulting in an end state where outP is a bit less early.

If the detected phase is consistently late (early), the voltage on outP will eventually reach a high (low) threshold. At this point a digital counter is incremented (decremented) and outP precharged to a zero state. In effect the accumulation of charge on outP serves as the initial filter for the phase control loop.

A common-mode control loop is needed to keep outP/outN from drifting off to the rails during operation. Details of this loop are not shown. This circuit can be chopper stabilized, or otherwise designed, to avoid offset.

Offsets in the lineP/lineN input devices can cause a systematic phase offset since, unlike the data receivers, the polarity is not flipped mid-bit. This can be canceled in two ways. First, the offset for the amplifiers could just be trimmed. An amplifier could be taken off line and calibrated by tying its inputs to a common voltage and then adjusting its offset (for example, with a current DAC) until its output remained balanced.

Alternatively offset can be canceled by enforcing an equal number of "0" and "1" phase detections—since they accumulate the offset in opposite directions. This balance could be enforced by keeping track of "0"s and "1"s and ignoring one or the other if the imbalance reaches a threshold. However that could run into problems if the input stream became very imbalanced. Another approach is to periodically flip lineP and lineN (and dP and dN). However with an adversarial bit stream this could result in exactly the wrong result.

If the clkiP signal used to gate the integrator is not foreshortened, a late (early) indication can only be detected if the preceding (following) bit differs from the current bit. This is not a problem since over time there will be enough bit transitions to get early and late detections. However the phase detection will converge faster if the clkiP pulse is shortened in duration while remaining centered.

Alternative systems can be implemented using digital control for the clock recovery circuit.

The example implementations described above are based on Manchester encoding, in which the set of data symbols consists of two symbols, 0 and 1, and the symbols are encoded as a code word <01> and its complement code word <10>. In an alternative system, Manchester encoding can be combined with amplitude modulation during each symbol cell to encode the values of more than one bit of input data in a single codeword. For example, a set of codewords for encoding multiple bits of data includes codewords that consist of a binary code word and one of a plurality of magnitudes of voltage swing for each codeword. Thus, a symbol set can be composed of a first symbol encoded as the binary code word of <01> with 10 millivolt swing, a second symbol encoded as the binary code word of <01> with 20 millivolt swing, a third symbol encoded as the binary code word of <10> with 10 millivolt swing, and a fourth symbol encoded as the binary code word of <10> with 20 millivolt swing. In this manner, multiple bits can be transmitted in each symbol cell on the transmission line with amplitude modulated Manchester encoding. The receiver for this multiple amplitude embodiment could be implemented with multiple sense amplifiers to sense the corresponding levels produced at the output of receiver integrators.

The Manchester encoded implementations described above can be extended to other DC balanced encoding techniques, including multi-bit orthogonal encoding systems and encoding techniques in which each code word is DC balanced within itself. For example, a set of C data symbols can be encoded as C code words of B bits each ($c_1, \ldots c_C$) that have the property that any member of the set multiplied by any other orthogonal member ($c_i$ XOR $c_j$) is DC balanced (equal numbers of 1s and 0s). Note that the number of bits B in each code word is always even, so B=4, 6, 8, and higher. Also, an additional set of C data symbols can be encoded as the complements of the code words. Thus the code words together with their complements can encode 2C data symbols. Note that the complements are not orthogonal to the code words, but can easily be distinguished from their complement code words. So a general example of a set of data symbols comprises a first subset of symbols that are encoded as orthogonal code words and a second subset of symbols that are encoded as complements of the orthogonal code words in the first subset. A Manchester encoded system does not have orthogonal symbols, because there are only two DC balanced code words with 2 bits, the symbol <01> and its complement <10>.

The receiver can be generalized as follows. Let $c_i'$ denote the complement of $c_i$. One can encode an alphabet of 2C symbols by transmitting the code word corresponding to each symbol. At the receiver, we have C integrators. Integrator i integrates a symbol cell in the received waveform XORed with code word $c_i$. Each integrator has three outcomes, first, $c_i$ is detected if a positive threshold is exceeded, second, $c_i'$ is detected if a negative threshold is exceeded, or, third, neither is detected if neither a positive nor a negative threshold is exceeded. After each symbol time exactly one integrator should detect one of its two code words, which is then output.

Figure 10:
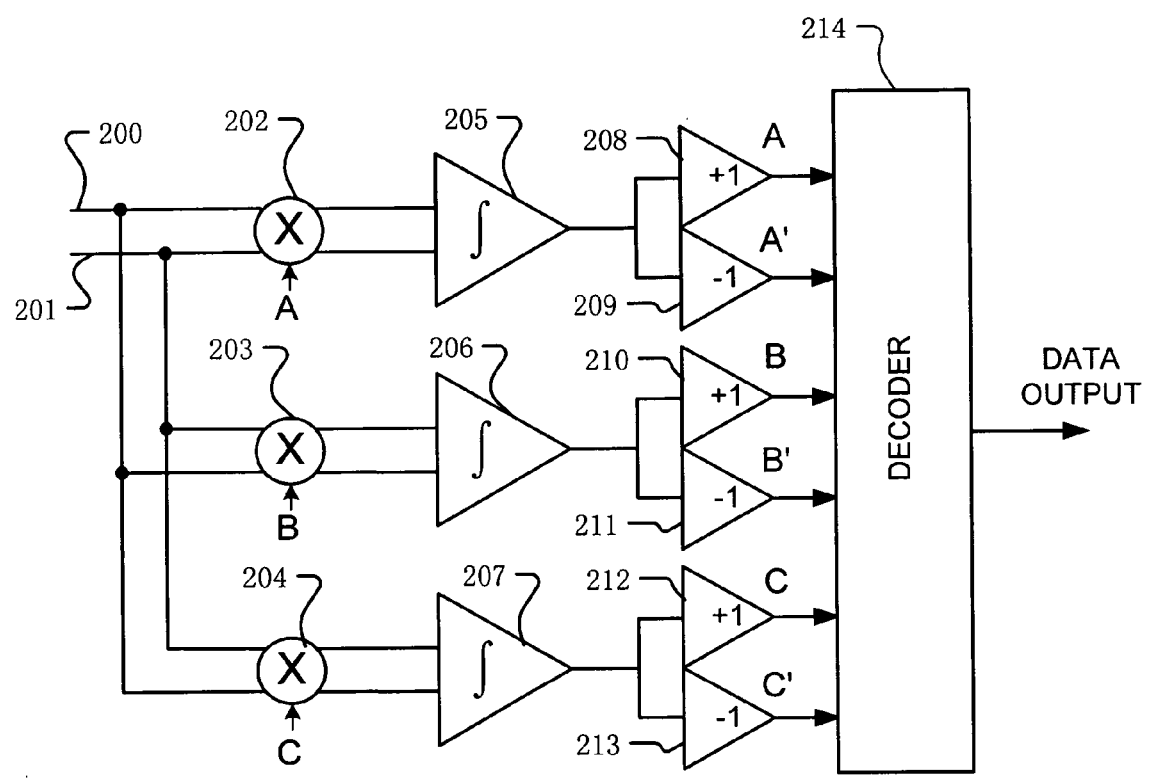
FIG. 10 is a simplified diagram of a receiver for multi-bit DC balanced, orthogonal encoded data.

For example, if B is 4 the DC balanced code words are <0011>, <0110>, <0101>, <1010>, <1001>,<1100>. The three orthogonal words are <0011>, <0110>, and <0101>. The other three are the complements. One can encode an alphabet of 6 symbols onto these strings (5 bits onto two strings—8 bit times on the wire). FIG. 10 illustrates a receiver for the symbol set consisting of the six symbols, A=<0011>, A'=<1100>, B=<0110>, B'=<1001>, C=<0101>, and C'=<1010>. The incoming data is applied on the positive polarity line 200 and the negative polarity line 201 which are coupled to three multipliers 202, 203, 204. Multiplier 202 combines the codeword A with the incoming signal during a symbol cell by an exclusive-OR operation. Multiplier 203 combines the codeword B with the incoming signal in a symbol cell by an exclusive-OR operation. Multiplier 204 combines the codeword C with the incoming signal in a symbol cell by an exclusive-OR operation. The orthogonal nature of the codewords insures that the output of the multiplier 202 will be <1111> if the input is codeword A, <0000> if the input is codeword A', and a DC balanced string otherwise. Likewise, the output of the multiplier 203 will be <1111> if the input is codeword B, <0000> if the input is codeword B', and a DC balanced string otherwise. Likewise, the output of the multiplier 204 will be <1111>, if the input is codeword C, <0000> if the input is codeword C', and a DC balanced string otherwise. The outputs of the multipliers 202, 203, 204 are applied to respective integrator circuits 205, 206, 207. Integrator 205 produces a positive result in response to the codeword A, a negative result in response to the codeword A', and zero otherwise. Integrator 206 produces a positive result in response to the codeword B, a negative result in response to the codeword B', and zero otherwise. Integrator 207 produces a positive result in response to the codeword C, a negative result in response to the codeword C', and zero otherwise. The outputs of the integrators 205, 206, 207 are applied to respective pairs of the sense amplifiers for the positive and negative results respectively. Thus, the output of the integrator 205 is applied to the positive threshold detector 208 to sense the codeword A and a negative threshold detector 209 to sense the codeword A'. The output of the integrator 206 is applied to the positive threshold detector 210 to sense the codeword B and a negative threshold detector 211 to sense the codeword B'. The output of the integrator 207 is applied to the positive threshold detector 212 to sense the codeword C and a negative threshold detector 213 to sense the codeword C'. The outputs of the threshold detectors 208-213 are applied to a decoder 214 that provides the decoded data.

Circuits described herein can be implemented using computer aided design tools available in the art, and embodied by computer readable files containing software descriptions of such circuits, at behavioral, register transfer, logic component, transistor and layout geometry level descriptions stored on storage media or communicated by carrier waves. Data formats in which such descriptions can be implemented include, but are not limited to, formats supporting behavioral languages like C, formats supporting register transfer level RTL languages like Verilog and VHDL, and formats supporting geometry description languages like GDSII, GDSIII, GDSIV, CIF, MEBES and other suitable formats and languages. Data transfers of such files on machine readable media including carrier waves can be done electronically over the diverse media on the Internet or through email, for example. Physical files can be implemented on machine readable media such as 4 mm magnetic tape, 8 mm magnetic tape, 3½ inch floppy media, CDs, DVDs and so on.

The system described herein applies DC balanced encoding, including Manchester encoding, to high-speed serial links, and to chip-to-chip communications, enabling high data rates and low power consumption. In addition, the system described herein provides novel circuitry suitable for integrated circuit implementation, with low-power, high-speed operation.

An embodiment includes a method for transmitting data comprising: encoding an input data stream to produce a sequence of codewords, wherein codewords in the sequence are members of a set of codewords representing data in the input data stream, and the members of the set are substantially DC balanced; and driving the sequence of codewords within a corresponding sequence of symbol cells on a transmission line, with power of less than 100 picoJoules per bit of data in the input data stream.

An embodiment includes a method as described in paragraph 87, set forth above, wherein the encoding comprises Manchester encoding.

An embodiment includes a method as described in paragraph 87, set forth above, wherein the set of codewords consists of two members.

An embodiment includes a method as described in paragraph 87, set forth above, wherein the set of codewords comprises more than two members.

An embodiment includes a method as described in paragraph 87, set forth above, wherein the set of codewords comprises a first subset of orthogonal code words and a second subset of code words that are complements of the orthogonal code words in the first subset.

An embodiment includes a method as described in paragraph 87, set forth above, including driving the sequence of codewords with less than 50 millivolts swing.

An embodiment includes a method as described in paragraph 87, set forth above, wherein codewords in the set of codewords include, respectively, a binary code word and one of a plurality of voltage swing amplitudes, whereby a particular binary code word with a first voltage swing amplitude represents a first data value, and the particular binary code word with a second voltage swing amplitude represents a second data value.

An embodiment includes a method as described in paragraph 87, set forth above, including driving the sequence of codewords at a data rate sufficient to transmit more than 1 gigabit per second of the input data stream.

An embodiment includes a method as described in paragraph 87, set forth above, including using resources on a single integrated circuit for the encoding and the driving.

An embodiment includes a method as described in paragraph 87, set forth above, including multiplexing bits in the data stream from parallel to serial prior to the encoding.

An embodiment includes a method as described in paragraph 87, set forth above, including multiplexing bits in the data stream from parallel to serial, and using a combined circuit for the multiplexing, encoding and driving.

An embodiment includes a method as described in paragraph 87, set forth above, including multiplexing bits in the data stream from parallel to serial, and using a combined circuit for the multiplexing, encoding and driving, wherein the combined circuit is a push-pull circuit.

An embodiment includes a method as described in paragraph 87, set forth above, including multiplexing bits in the data stream from parallel to serial, and using a combined circuit for the multiplexing, encoding and driving, wherein the combined circuit is a differential circuit.

An embodiment includes a method as described in paragraph 87, set forth above, wherein the transmission line comprises a differential pair of conductors.

An embodiment includes a method as described in paragraph 87, set forth above, wherein the transmission line comprises a single printed circuit board conductor or a differential pair of printed circuit board conductors.

An embodiment includes a method as described in paragraph 87, set forth above, wherein the transmission line comprises a twisted pair cable.

The method of claim 1, wherein the transmission line comprises a single-ended transmission line.

An embodiment includes a method as described in paragraph 87, set forth above, including driving the sequence of codewords at a data rate using a clock having a frequency that is half of the data rate.

An embodiment includes a method as described in paragraph 87, set forth above, including a coupling the sequence of codewords via a differentiating circuit to the transmission line.

An embodiment includes a data transmitter comprising: means for encoding an input data stream to produce a sequence of codewords, wherein codewords in the sequence are members of a set of codewords representing data in the data stream, and the members of the set are substantially DC balanced; and means for driving the sequence of codewords within a corresponding sequence of symbol cells on a transmission line, with power of less than 100 picoJoules per bit of data in the data stream.

An embodiment includes a n article, comprising: a data file in a machine readable medium, comprising a characterization of an integrated circuit module, the module comprising: an encoder having a data input to encode an input data stream to produce a sequence of codewords, wherein codewords in the sequence are members of a set of codewords representing data in the input data stream, and the members of the set are substantially DC balanced; and a driver, coupled to the encoder, to drive the sequence of codewords within a corresponding sequence of symbol cells on a transmission line, with power of less than 100 picoJoules per bit of data in the data stream.

While the present invention is disclosed by reference to the preferred embodiments and examples detailed above, it is to be understood that these examples are intended in an illustrative rather than in a limiting sense. It is contemplated that modifications and combinations will readily occur to those skilled in the art, which modifications and combinations will be within the spirit of the invention and the scope of the following claims.

What is claimed is:

1. A data transmitter comprising:
   an encoder having a data input that encodes an input data stream to produce a sequence of codewords, wherein codewords in the sequence are members of a set of codewords representing data in the input data stream, and the members of the set are substantially DC balanced; and
   a driver, coupled to the encoder, that drives the sequence of codewords within a corresponding sequence of symbol cells on a transmission line, with power of less than 100 picoJoules per bit of data in the data stream.

2. The transmitter of claim 1, wherein the encoder comprises a Manchester encoder.

3. The transmitter of claim 1, wherein the set of codewords consists of two members.

4. The transmitter of claim 1, wherein the set of codewords comprises more than two members.

5. The transmitter of claim 1, wherein the set of codewords comprises a first subset of orthogonal code words and a second subset of code words that are complements of the orthogonal code words in the first subset.

6. The transmitter of claim 1, wherein the driver drives the sequence of codewords with less than 50 millivolts swing.

7. The transmitter of claim 1, wherein codewords in the set of codewords include, respectively, a binary code word and one of a plurality of voltage swing amplitudes, whereby a particular binary code word with a first voltage swing amplitude represents a first data value, and the particular binary code word with a second voltage swing amplitude represents a second data value.

8. The transmitter of claim 1, wherein the driver drives the sequence of codewords at a data rate sufficient to transmit more than 1 gigabit per second of the input data stream.

9. The transmitter of claim 1, wherein the encoder and the driver comprise elements on a single integrated circuit.

10. The transmitter of claim 1, including a multiplexer converting the input data stream from parallel to serial.

11. The transmitter of claim 1, including a multiplexer converting the input data stream from parallel to serial, and using a combined circuit for the multiplexer, encoder and driver.

12. The transmitter of claim 1, including a multiplexer converting the input data stream from parallel to serial, and using a combined circuit for the multiplexer, encoder and driver, wherein the combined circuit is a push-pull circuit.

13. The transmitter of claim 1, including a multiplexer converting the input data stream from parallel to serial, and using a combined circuit for the multiplexer, encoder and driver, wherein the combined circuit is a differential circuit.

14. The transmitter of claim 1, wherein the encoder comprises exclusive-OR logic.

15. The transmitter of claim 1, wherein the transmission line comprises a differential pair of conductors.

16. The transmitter of claim 1, wherein the transmission line comprises single printed circuit board conductor or a differential pair of printed circuit board conductors.

17. The transmitter of claim 1, wherein the transmission line comprises a twisted pair cable.

18. The transmitter of claim 1, wherein the transmission line comprises a single-ended transmission line.

19. The transmitter of claim 1, wherein the driver drives the sequence of codewords at a data rate using a clock having a frequency that is half of the data rate.

20. The transmitter of claim 1, including a differentiating circuit arranged to couple the driver to the transmission line.

* * * * *

UNITED STATES PATENT AND TRADEMARK OFFICE
CERTIFICATE OF CORRECTION

PATENT NO. : 7,268,706 B2 Page 1 of 1
APPLICATION NO. : 11/342780
DATED : September 11, 2007
INVENTOR(S) : William J. Dally and John W. Poulton It is certified that error appears in the above-identified patent and that said Letters Patent is hereby corrected as shown below:

In claim 7, column 19, line 40, cancel "inelude" and replace with -- include --.

Signed and Sealed this

Twenty-seventh Day of November, 2007

JON W. DUDAS
*Director of the United States Patent and Trademark Office*